(12) United States Patent  (10) Patent No.: US 8,947,897 B2
Yamanaka  (45) Date of Patent: Feb. 3, 2015

(54) CURRENT-SOURCE POWER CONVERTING APPARATUS

(75) Inventor: Katsutoshi Yamanaka, Kitayushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 423 days.

(21) Appl. No.: 13/406,427

(22) Filed: Feb. 27, 2012

(65) Prior Publication Data

US 2012/0218801 A1  Aug. 30, 2012

(30) Foreign Application Priority Data

Feb. 28, 2011 (JP) ................. 2011-042764
Dec. 27, 2011 (JP) ................. 2011-284783

(51) Int. Cl.
*H02M 5/42* (2006.01)
*H03K 7/08* (2006.01)
*H02M 7/5387* (2007.01)

(52) U.S. Cl.
CPC ............. *H03K 7/08* (2013.01); *H02M 7/53875* (2013.01)
USPC ............................................ 363/98; 363/132

(58) Field of Classification Search
USPC ................. 363/16–20, 34–41, 97, 98, 132
See application file for complete search history.

(56) References Cited

U.S. PATENT DOCUMENTS 5,016,158 A * 5/1991 Matsui et al. ................... 363/71
5,038,092 A  8/1991 Asano et al.
5,729,449 A  3/1998 Takada et al.
5,917,721 A * 6/1999 Kerkman et al. ................ 363/98
6,545,884 B2 * 4/2003 Curtiss ........................... 363/37
7,504,790 B2 * 3/2009 Tsuji et al. ..................... 318/432
7,741,902 B2 * 6/2010 Guo et al. ....................... 330/10
7,818,983 B2 * 10/2010 Jun ............................. 68/12.23

FOREIGN PATENT DOCUMENTS

JP  09-182458  7/1997
JP  2008-312367  12/2008

OTHER PUBLICATIONS

Extended European Search Report for corresponding EP Application No. 12156777.0-1810, Apr. 11, 2013.
Japanese Decision of a Patent Grant for corresponding JP Application No. 2011-284783, Dec. 17, 2013.

* cited by examiner

*Primary Examiner* — Rajnikant Patel
(74) *Attorney, Agent, or Firm* — Mori & Ward, LLP

(57) ABSTRACT

A current-source power converting apparatus in an embodiment includes a current-reference generating unit, a polarity determining unit, a PWM-pulse-signal generating unit, and a drive-signal generating unit. The current-reference generating unit outputs a phase current reference and a line-to-line current reference. The polarity determining unit determines a polarity of the phase current reference. The PWM-pulse-signal generating unit generates a PWM pulse signal by comparing the line-to-line current reference and a carrier signal. The drive-signal generating unit generates a drive signal that drives each of a plurality of switching elements, based on the PWM pulse signal and a polarity of the phase current reference.

8 Claims, 19 Drawing Sheets

CURRENT-SOURCE POWER CONVERTING APPARATUS

CROSS-REFERENCE TO RELATED APPLICATION

This application is based upon and claims the benefit of priority of the prior Japanese Patent Application No. 2011-042764, filed on Feb. 28, 2011; Japanese Patent Application No. 2011-284783, filed on Dec. 27, 2011, the entire contents of both of which are incorporated herein by reference.

FIELD

The embodiments discussed herein are directed to a current-source power converting apparatus.

BACKGROUND

Conventionally, a current-source power converting apparatus that generates drive signals of switching elements based on current references is known. For example, there is known a current-source power converting apparatus that generates a drive signal of a switching element by using logical AND of one PWM pulse signal and a NOT signal of another PWM pulse signal among PWM pulse signals of three different interphases generated by comparing current references (hereinafter, described as line-to-line current references) corresponding to three different interphases (UW-phase, VU-phase, and WV-phase) and a carrier signal (for example, triangle wave signal) (for example, see Japanese Patent Laid-open Publication No. H09-182458).

In a current-source power converting apparatus that outputs power of a DC source via switching elements, when all of the switching elements are turned off in a state where a carrier signal is larger or smaller than all of three line-to-line current references, current from the DC source is interrupted. Because the DC source has a large inductance, interruption of current from the DC source causes generation of overvoltage.

Therefore, in the conventional current-source power converting apparatus, when the carrier signal is larger or smaller than all of the three line-to-line current references, a current vector, whose magnitude is zero, is output to ensure a current path of the DC source. Specifically, the current-source power converting apparatus described in Japanese Patent Laid-open Publication No. H09-182458 is provided with a circuit, which monitors a state in which the carrier signal is larger or smaller than all of the three line-to-line current references, and a D flip-flop circuit which, in such a state, generates drive signals for driving switching elements on both pole sides, i.e., positive and negative sides, of a predetermined phase (for example, U-phase) for outputting a current vector whose magnitude is zero.

However, in the above conventional current-source power converting apparatus, propagation delay occurs by propagation of PWM pulse signals generated by comparing the line-to-line current references and the carrier signal and a signal indicating whether the carrier signal is rising or falling through a D flip-flop circuit. Therefore, in logic circuits after the D flip-flop circuit, a pulse (glitch) having a pulse width of a propagation delay time difference t, which is not normally generated and has a relatively short width, is generated and distortion of an output current occurs due to this.

SUMMARY

A current-source power converting apparatus in an embodiment includes a current-reference generating unit, a polarity determining unit, a PWM-pulse-signal generating unit, and a drive-signal generating unit. The current-reference generating unit outputs a phase current reference and a line-to-line current reference. The polarity determining unit determines a polarity of the phase current reference. The PWM-pulse-signal generating unit generates a PWM pulse signal by comparing the line-to-line current reference and a carrier signal. The drive-signal generating unit generates a drive signal that drives each of a plurality of switching elements, based on the PWM pulse signal and a polarity of the phase current reference.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Hereinafter, some embodiments of a current-source power converting apparatus disclosed in the present application will be described in detail with reference to the accompanying drawings. This invention is not limited to each embodiment described below.

(First Embodiment)

A current-source power converting apparatus according to the first embodiment generates switch drive signals based on PWM pulse signals and phase-current polarity signals without including a circuit, which monitors a state of outputting a current vector, whose magnitude is zero, based on PWM pulse signals, and a D flip-flop circuit. In this current-source power converting apparatus, because a D flip-flop circuit and the like are not included, generation of a short pulse (glitch) generated due to a propagation delay time difference in a logic circuit can be suppressed, so that distortion of an output current due to generation of a glitch can be suppressed. A current vector, whose magnitude is zero, is called a zero-current vector or a zero vector, and in the followings, a current vector, whose magnitude is zero, is described as a zero-current vector or a zero vector.

A configuration of a current-source power converting apparatus 100 according to the first embodiment is specifically explained below with reference to the drawings.

Figure 1:
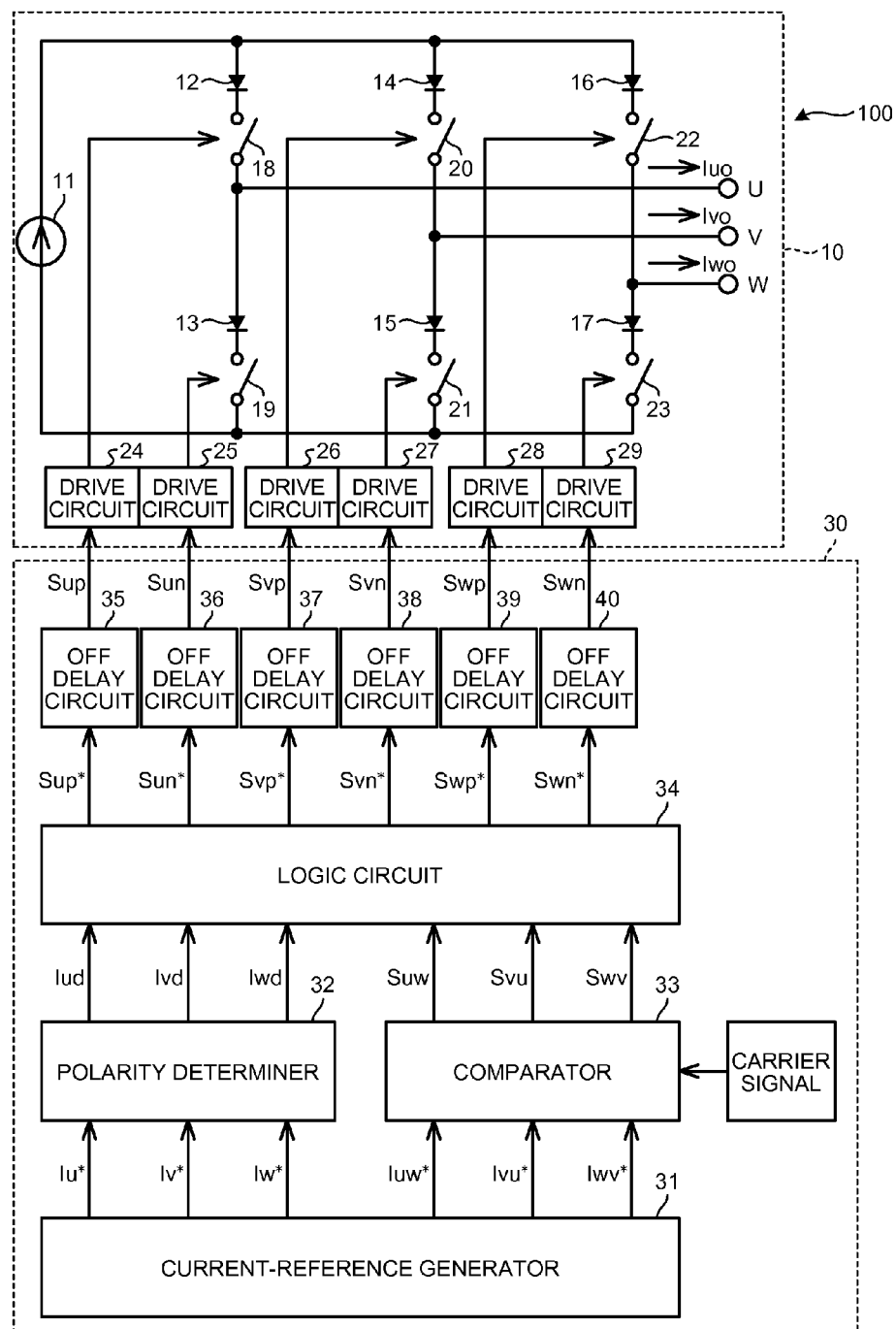
FIG. 1 is a block diagram of a current-source power converting apparatus according to a first embodiment.

As shown in FIG. 1, the current-source power converting apparatus 100 according to the first embodiment includes a current-source inverter circuit 10 and a switch-drive-signal generating unit 30 that generates signals for driving switching elements 18 to 23 of the current-source inverter circuit 10. The current-source power converting apparatus 100 outputs AC power of three phases (U-phase, V-phase, and W-phase) by driving the current-source inverter circuit 10 by the switch-drive-signal generating unit 30.

The current-source inverter circuit 10 includes a DC source 11, six rectifier elements 12 to 17, the six switching elements 18 to 23, and six drive circuits 24 to 29 that drive the switching elements 18 to 23. The switching elements 18 to 23 are switching elements, such as an IGBT (insulated gate bipolar transistor) and a MOSFET (field-effect transistor), that are turned on/off by drive signals. A reverse blocking IGBT can be used instead of the rectifier elements 12 to 17 and the switching elements 18 to 23 composed of IGBTs.

The positive terminal of the DC source 11 is connected to anode sides (input sides) of the rectifier elements 12, 14, and 16. The cathode sides (output sides) of the rectifier elements 12, 14, and 16 are connected to one terminals of the switching elements 18, 20, and 22, respectively. The other terminals of the switching elements 18, 20, and 22 are connected to a U-phase terminal, a V-phase terminal, and a W-phase terminal, respectively. Moreover, the other terminals of the switching elements 18, 20, and 22 are connected to anode sides (input sides) of the rectifier elements 13, 15, and 17, respectively. The cathode sides (output sides) of the rectifier elements 13, 15, and 17 are connected to one terminals of the switching elements 19, 21, and 23, respectively. The other terminals of the switching elements 19, 21, and 23 are connected to the negative terminal of the DC source 11. Moreover, the drive circuits 24 to 29 are connected to the switching elements 18 to 23, respectively.

The switch-drive-signal generating unit 30 includes a current-reference generator 31, a polarity determiner 32, a comparator 33, a logic circuit 34, and six off delay circuits 35 to 40. The off delay circuit delays turn-off of a switching element for preventing output of the DC source 11 from being in an opened state due to, for example, delay in operation of the switching element. The current-reference generator 31 is an example of a "current-reference generating unit". The polarity determiner 32 is an example of a "polarity determining unit". The comparator 33 is an example of a "PWM-pulse-signal generating unit". The logic circuit 34 is an example of a "drive-signal generating unit".

The current-reference generator 31 is connected to the polarity determiner 32 and the comparator 33. The comparator 33 is configured such that a carrier signal (carrier) is input thereto. The polarity determiner 32 and the comparator 33 are connected to the logic circuit 34. The logic circuit 34 is connected to the six off delay circuits 35 to 40. The six off delay circuits 35 to 40 are connected to the drive circuits 24 to 29 of the current-source inverter circuit 10, respectively.

Next, each component of the switch-drive-signal generating unit 30 is explained in detail.

In the first embodiment, the current-reference generator 31 is configured to output phase current references Iu*, Iv*, and Iw* (see FIG. 7) and line-to-line current references Iuw*, Ivu*, and Iwv* (see FIG. 7) in parallel when output of the current-source inverter circuit 10 is a sine wave. The relationship between the phase current references Iu*, Iv*, and Iw* and the line-to-line current references Iuw*, Ivu*, and Iwv* is expressed by the following Equation (1) to Equation (3).

$$Iuw^* = \tfrac{1}{3}(Iu^* - Iw^*) \tag{1}$$

$$Ivu^* = \tfrac{1}{3}(Iv^* - Iu^*) \tag{2}$$

$$Iwv^* = \tfrac{1}{3}(Iw^* - Iv^*) \tag{3}$$

Figure 2:
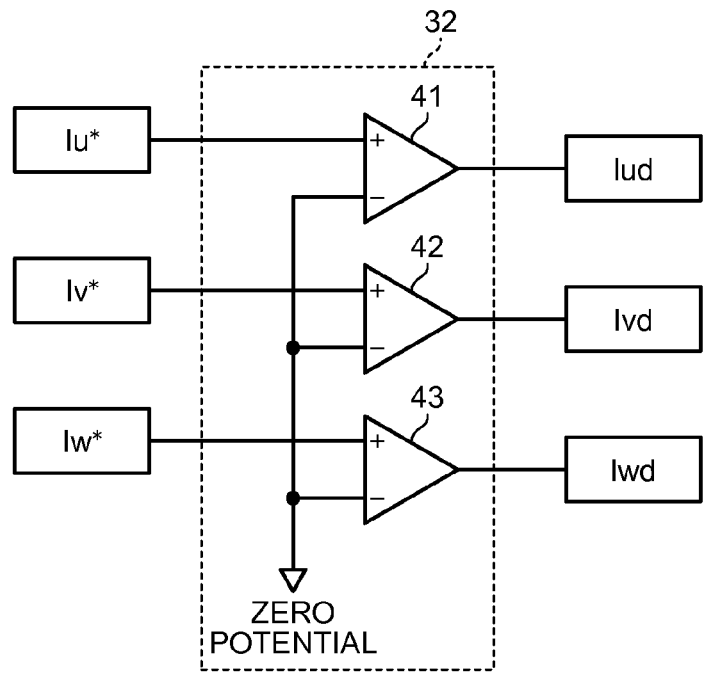
FIG. 2 is a circuit diagram of a polarity determiner of the current-source power converting apparatus according to the first embodiment.

As shown in FIG. 2, the polarity determiner 32 includes three comparators 41 to 43. The comparator 41 (the comparator 42 and the comparator 43) is configured such that the phase current reference Iu* (Iv* and Iw*) is input thereto and is configured to compare the phase current reference Iu* (Iv* and Iw*) with a zero potential and, when the phase current reference Iu* (Iv* and Iw*) is positive, output a High phase-current polarity signal Iud (Ivd and Iwd) and, when the phase current reference Iu* (Iv* and Iw*) is negative, output a Low phase-current polarity signal Iud (Ivd and Iwd).

Figure 3:
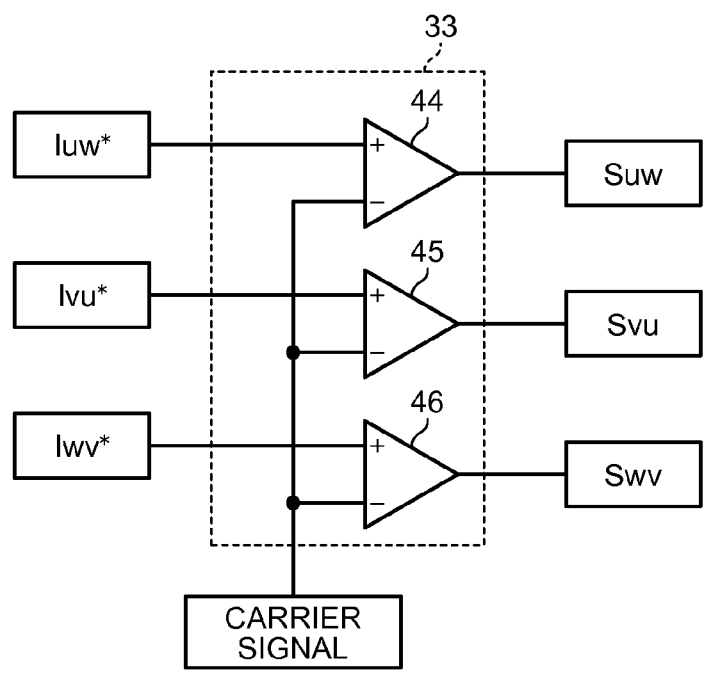
FIG. 3 is a circuit diagram of a comparator of the current-source power converting apparatus according to the first embodiment.

As shown in FIG. 3, the comparator 33 includes three comparators 44 to 46. The comparator 44 (the comparator 45 and the comparator 46) is configured such that the line-to-line current reference Iuw* (Ivu* and Iwv*) is input thereto and is configured to compare the line-to-line current reference Iuw* (Ivu* and Iwv*) with the carrier signal (carrier), and, when the line-to-line current reference is equal to or more than the carrier, output a High PWM pulse signal Suw (Svu and Swv) and, when the line-to-line current reference is less than the carrier, output a Low PWM pulse signal Suw (Svu and Swv). In this embodiment, the carrier signal to be compared with the line-to-line current references Iuw*, Ivu*, and Iwv* is a triangle wave signal, however, this is not limited thereto.

Figure 4:
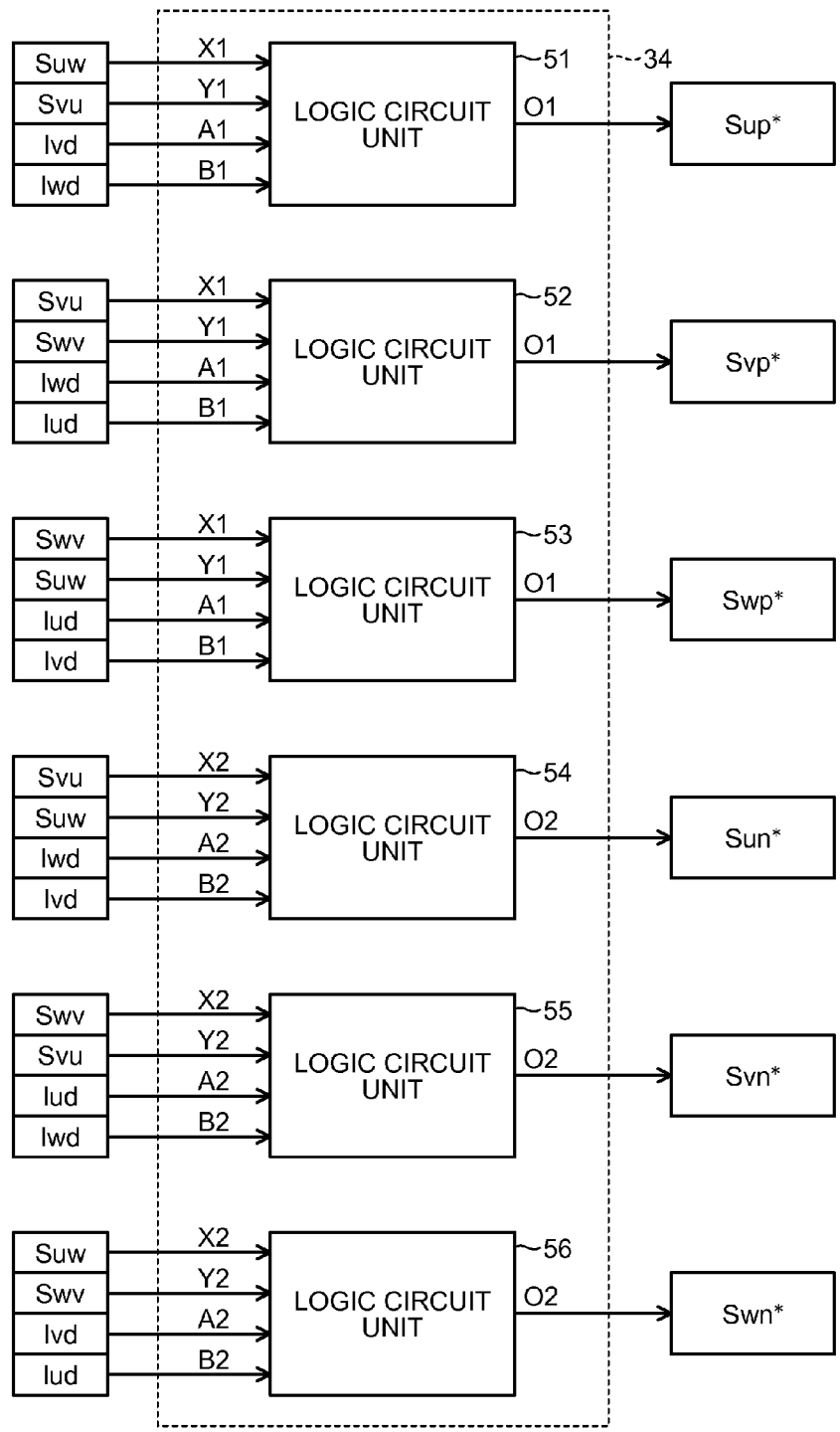
FIG. 4 is a block diagram of a logic circuit of the current-source power converting apparatus according to the first embodiment.

As shown in FIG. 4, the logic circuit 34 includes six logic circuit units 51 to 56. In the first embodiment, the logic circuit 34 (the logic circuit units 51 to 56) is configured to output switch drive signals Sup*, Sun*, Svp*, Svn*, Swp*, and Swn* based on an AND operation of two PWM pulse signals among three PWM pulse signals Suw, Svu, and Swv of mutually different output interphases (between U-phase and W-phase, between V-phase and U-phase, and between W-phase and V-phase) and two phase-current polarity signals among the phase-current polarity signals Iud, Ivd, and Iwd of three phases (U-phase, V-phase, and W-phase). The switch drive signals Sup* and Sun* are switch drive signals that drive the switching element 18 on a positive side of the U-phase and the switching element 19 on a negative side of the U-phase, respectively. The switch drive signals Svp* and Svn* are switch drive signals that drive the switching element 20 on a positive side of the V-phase and the switching element 21 on a negative side of the V-phase, respectively. The switch drive signals Swp* and Swn* are switch drive signals that drive the switching element 22 on a positive side of the W-phase and the switching element 23 on a negative side of the W-phase, respectively.

The switch drive signal Sup*, which drives the switching element 18 on a positive side of the U-phase, is generated by the logic circuit unit 51 using the PWM pulse signals Suw and Svu relating to the U-phase and the phase-current polarity signals Ivd and Iwd not relating to the U-phase. In the similar manner to the switch drive signal Sup*, the switch drive signals Svp*, Swp*, Sun*, Svn*, and Swn* are generated by the logic circuit units 52 to 56 using two PWM pulse signals relating to a phase of a switch drive signal and two phase-current polarity signals not relating to a phase of a switch drive signal.

The internal logic of the logic circuit units 51 to 53 is expressed by the following Equation (4). The internal logic of the logic circuit units 54 to 56 is expressed by the following Equation (5). In other words, the following Equation (4) corresponds to the logic circuit unit 51 (52 and 53) shown in FIG. 5 in one-to-one relationship. Moreover, the following Equation (5) corresponds to the logic circuit unit 54 (55 and 56) shown in FIG. 6 in one-to-one relationship. In the following Equation (4) and Equation (5), a signal (for example, A1) with a "bar" means an inversion signal of a signal A1.

$$O1 = \overline{A1} \cdot B1 \cdot X1 + A1 \cdot \overline{B1} \cdot \overline{Y1} + \overline{A1} \cdot \overline{B1} \cdot X1 \cdot \overline{Y1} \quad (4)$$

$$O2 = A2 \cdot \overline{B2} \cdot X2 + \overline{A2} \cdot B2 \cdot \overline{Y2} + A2 \cdot B2 \cdot X2 \cdot \overline{Y2} \quad (5)$$

In Equation (4), X1 and Y1 are switch drive signals input to the logic circuit units 51 to 53 that drive positive-side switching elements of respective phases and A1 and B1 are phase-current polarity signals input to the logic circuit units 51 to 53 that drive positive-side switching elements of respective phases. Moreover, in Equation (5), X2 and Y2 are switch drive signals input to the logic circuit units 54 to 56 that drive negative-side switching elements of respective phases and A2 and B2 are phase-current polarity signals input to the logic circuit units 54 to 56 that drive negative-side switching elements of respective phases. Moreover, in Equation (4), O1 is switch drive signals (Sup*, Svp*, and Swp*) on a positive side output from the logic circuit units 51 to 53 and, in Equation (5), O2 is switch drive signals (Sun*, Svn*, and Swn*) on a negative side output from the logic circuit units 54 to 56.

The process of the logic circuit unit 51 is explained with reference to FIG. 4 and Equation (4). In the first term on the right-hand side of Equation (4), when the phase-current polarity signal A1 (Ivd) is Low and the phase-current polarity signal B1 (Iwd) is High, the switch drive signal O1 (Sup*) is X1 (Suw). In the second term on the right-hand side, when the phase-current polarity signal A1 (Ivd) is High and the phase-current polarity signal B1 (Iwd) is Low, the switch drive signal O1 (Sup*) is an inversion signal of Y1 (Svu). In the third term on the right-hand side, when the phase-current polarity signal A1 (Ivd) is Low and the phase-current polarity signal B1 (Iwd) is Low, the switch drive signal O1 (Sup*) is an AND signal of X1 (Suw) and inverted Y1 (Svu). Other logic circuit units 52 and 53 are similar to the above. The logic circuit units 54 to 56 can be processed in the similar manner by using Equation (5).

In this manner, in the current-source power converting apparatus 100 according to the first embodiment, a switch drive signal can be determined according to combination of polarities of phase-current polarity signals, so that an order of a switch drive signal and a current vector can be determined without providing a circuit, which monitors a state of outputting a zero vector, and a D flip-flop circuit.

Figure 5:
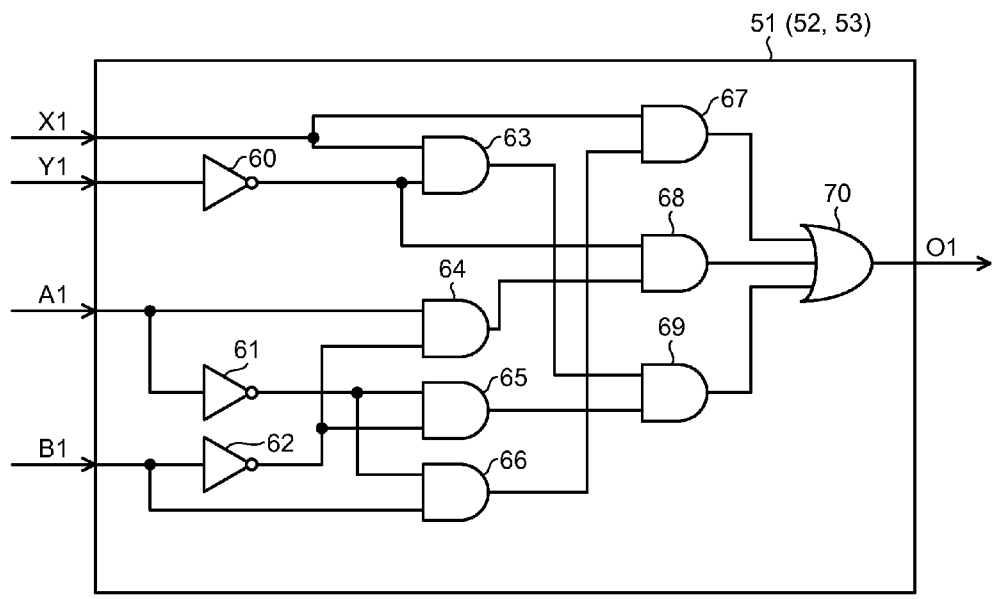
FIG. 5 is a circuit diagram of a logic circuit unit that generates a switch drive signal of a switching element on a positive terminal side of the current-source power converting apparatus according to the first embodiment.

As shown in FIG. 5, the logic circuit units 51 to 53 each include three NOT circuits 60 to 62, seven AND circuits 63 to 69, and an OR circuit 70. The signal X1 input to the logic circuit units 51 to 53 is configured to be input to the AND circuit 63 and the AND circuit 67. The signal Y1 is configured to be input to the NOT circuit 60. The signal A1 is configured to be input to the AND circuit 64 and the NOT circuit 61. The signal B1 is configured to be input to the NOT circuit 62 and the AND circuit 66.

The output side of the NOT circuit 60 is connected to the input sides of the AND circuit 63 and the AND circuit 68. The output side of the NOT circuit 61 is connected to the input sides of the AND circuit 65 and the AND circuit 66. The output side of the NOT circuit 62 is connected to the input sides of the AND circuit 64 and the AND circuit 65.

The output side of the AND circuit 63 is connected to the input side of the AND circuit 69. The output side of the AND circuit 64 is connected to the input side of the AND circuit 68. The output side of the AND circuit 65 is connected to the input side of the AND circuit 69. The output side of the AND circuit 66 is connected to the input side of the AND circuit 67. The output sides of the AND circuits 67 to 69 are connected to the input side of the OR circuit 70.

Figure 6:
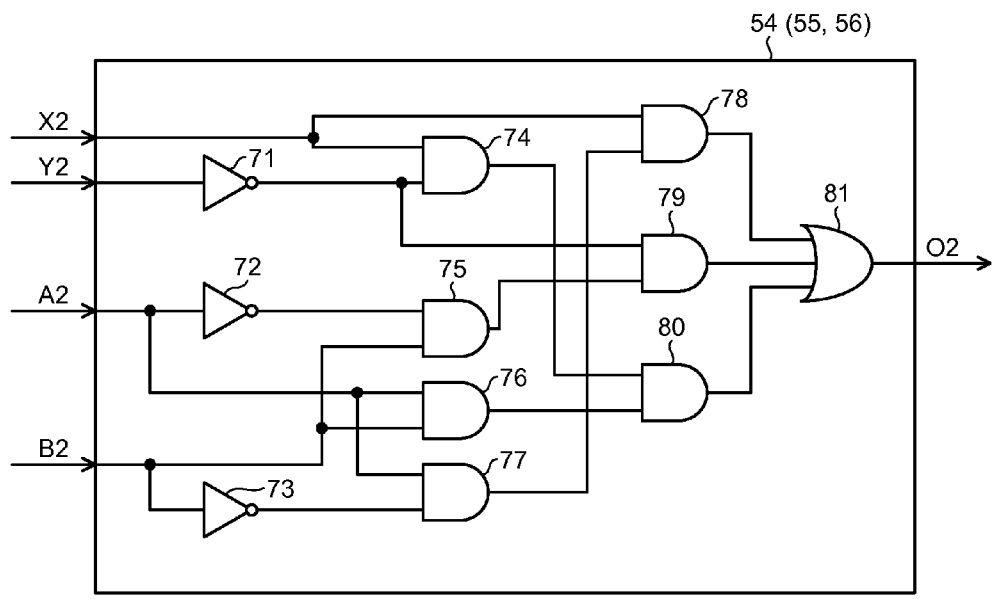
FIG. 6 is a circuit diagram of a logic circuit unit that generates a switch drive signal of a switching element on a negative terminal side of the current-source power converting apparatus according to the first embodiment.

As shown in FIG. 6, the logic circuit units 54 to 56 each include three NOT circuits 71 to 73, seven AND circuits 74 to 80, and an OR circuit 81. The signal X2 input to the logic circuit units 54 to 56 is input to the AND circuit 74 and the AND circuit 78. The signal Y2 is input to the NOT circuit 71. The signal A2 is input to the NOT circuit 72, the AND circuit 76, and the AND circuit 77. The signal B2 is input to the AND circuit 75, the AND circuit 76, and the NOT circuit 73.

The output side of the NOT circuit 71 is connected to the input sides of the AND circuit 74 and the AND circuit 79. The output side of the NOT circuit 72 is connected to the input side of the AND circuit 75. The output side of the NOT circuit 73 is connected to the input side of the AND circuit 77.

The output side of the AND circuit 74 is connected to the input side of the AND circuit 80. The output side of the AND circuit 75 is connected to the input side of the AND circuit 79.

The output side of the AND circuit 76 is connected to the input side of the AND circuit 80. The output side of the AND circuit 77 is connected to the input side of the AND circuit 78. The output sides of the AND circuits 78 to 80 are connected to the input side of the OR circuit 81.

Then, as shown in FIG. 4, the six logic circuit units 51 to 56 are configured to output the switch drive signals Sup*, Svp*, Swp*, Sun*, Svn*, and Swn*, respectively. Moreover, the switch drive signals Sup*, Sun*, Svp*, Svn*, Swp*, and Swn* are input to the off delay circuits 35 to 40, respectively. The off delay circuits 35 to 40 are configured to output switch drive signals Sup, Sun, Svp, Svn, Swp, and Swn to the drive circuits 24 to 29. Switch drive signals are distinguished by adding a symbol * to a switch drive signal (such as Sup*) before passing the off delay circuits 35 to 40 and not adding a symbol * to a switch drive signal (such as Sup) after passing the off delay circuits 35 to 40.

Figure 7:
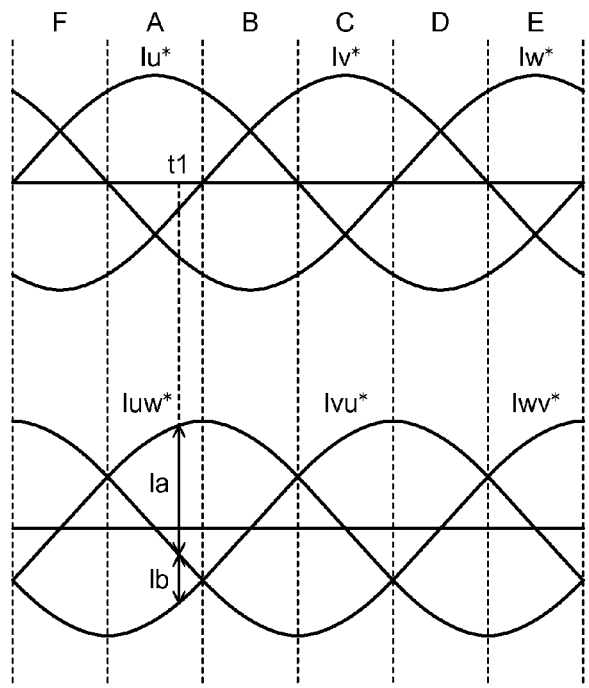
FIG. 7 is a diagram illustrating a relationship between phase current references and line-to-line current references of the current-source power converting apparatus according to the first embodiment.

FIG. 7 illustrates a relationship between phase current references and line-to-line current references for one cycle and illustrates this cycle in a divided manner into six regions A to F for each electric angle 60°. The region A is a region in which the phase current reference Iu* includes a positive-side peak value, the region B is a region in which the phase current reference Iw* includes a negative-side peak value, and the region C is a region in which the phase current reference Iv* includes a positive-side peak value. The region D is a region in which the phase current reference Iu* includes a negative-side peak value, the region E is a region in which the phase current reference Iw* includes a positive-side peak value, and the region F is a region in which the phase current reference Iv* includes a negative-side peak value. The output vectors of the current-source inverter circuit 10 in FIG. 7 are described by a spatial vector diagram shown in FIG. 8. The regions A to F in FIG. 7 correspond to regions A to F in FIG. 8. Moreover, Ia and Ib in FIG. 7 are represented as a magnitude of a vector Ia and a vector Ib in FIG. 8, respectively. The current-source inverter circuit 10 can output nine vectors, i.e., six effective vectors Iuw, Ivw, Ivu, Iwu, Iwv, and Iuv and three zero vectors Iuu, Ivv, and Iww, whose magnitude is zero, in FIG. 8. An output state of current at a t1 point shown in FIG. 7 is generated by zero vectors (Iuu, Ivv, and Iww) adjacent to the region A in FIG. 8 and two effective vectors (in this case, Iuw and Iuv among Iuw, Ivw, Ivu, Iwu, Iwv, and Iuv) and this output state is expressed as a current reference vector Iout_r in FIG. 8. In order to output current expressed by the current reference vector Iout_r, time of outputting the zero vectors and the two effective vectors (vectors other than the zero vectors) is adjusted. The output current of the current-source inverter circuit 10 is modulated in such a manner.

Figure 8:
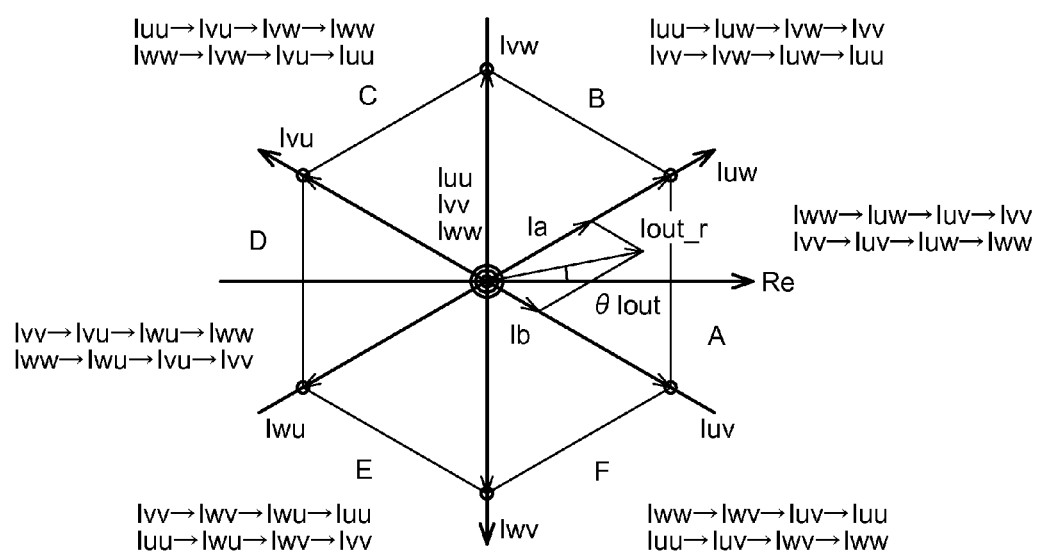
FIG. 8 is a spatial vector diagram of the current-source power converting apparatus according to the first embodiment.

Moreover, the vector Ia shown in FIG. 8 represents an Iuw vector direction component of the current reference vector Iout_r and the vector Ib represents an Iuv vector direction component of the current reference vector Iout_r. The peak values of the line-to-line current references Iuw*, Ivu*, and Iwv* in FIG. 7 become equal to the current value of the DC source 11 (see FIG. 1). If the magnitude of the effective vectors Iuw, Ivw, Ivu, Iwu, Iwv, and Iuv in FIG. 8 is equal to the current value of the DC source 11, the magnitude of the vector Ia and the vector Ib in FIG. 8 matches scalar quantities Ia and Ib shown in FIG. 7.

In the current-source power converting apparatus 100, a PWM method is used for outputting the current reference vector Iout_r. For example, T$a$, which is the time of outputting the effective vector Iuw, and T$b$, which is the time of outputting the effective vector Iuv, are determined as follow:

$$Ta:T=Ia:IL,\ Tb:T=Ib:IL$$

where T is a control priod of PWM and IL is a current value of the DC source 11. In the control priod T, the effective vector Iuw is output for the time Ta and the effective vector Iuv is output for the time T$b$, and a zero vector is output for the remainder of the control priod T, thereby outputting the state of the current reference vector Iout_r.

An order of current vectors output during one cycle (=1/frequency of carrier signal) of a PWM carrier in the first embodiment is expressed as follows in each region by the above equations (Equations (4) and (5)).

$$Iww \rightarrow Iuw \rightarrow Iuv \rightarrow Ivv \rightarrow Iuv \rightarrow Iuw \rightarrow Iww \quad \text{(region A)}$$

$$Iuu \rightarrow Iuw \rightarrow Ivw \rightarrow Ivv \rightarrow Ivw \rightarrow Iuw \rightarrow Iuu \quad \text{(region B)}$$

$$Iuu \rightarrow Ivu \rightarrow Ivw \rightarrow Iww \rightarrow Ivw \rightarrow Ivu \rightarrow Iuu \quad \text{(region C)}$$

$$Ivv \rightarrow Ivu \rightarrow Iwu \rightarrow Iww \rightarrow Iwu \rightarrow Ivu \rightarrow Ivv \quad \text{(region D)}$$

$$Ivv \rightarrow Iwv \rightarrow Iwu \rightarrow Iuu \rightarrow Iwu \rightarrow Iwv \rightarrow Ivv \quad \text{(region E)}$$

$$Iww \rightarrow Iwv \rightarrow Iuv \rightarrow Iuu \rightarrow Iuv \rightarrow Iwv \rightarrow Iww \quad \text{(region F)}$$

An order of current vectors in each region shown in FIG. 8 is illustrated for each half cycle of one cycle of a PWM carrier (for example, in the region A, Iww→Iuw→Iuv→Ivv and Ivv→Iuv→Iuw→Iww). Moreover, in FIG. 10, an order of current vectors in the region A is described. In the first embodiment, the configuration is such that a phase of a zero vector, which is a current vector when the magnitude of the carrier signal is larger than all of the line-to-line current references (carrier signal is near the maximum point) or smaller than all of the line-to-line current references (carrier signal is near a minimum point), is selected and output so that the width of the switch drive signals Sup*, Sun*, Svp*, Svn*, Swp*, and Swn* is suppressed from becoming short. For example, in the region A, the configuration is such that zero vectors are output by selecting in order of Iww (carrier signal is near a maximum point), Ivv (carrier signal is near a minimum point), and Iww (carrier signal is near a maximum point). In other words, the configuration is such that a phase of a zero vector becomes different between a maximum point of the carrier signal and a minimum point of the carrier signal adjacent to a maximum point of the carrier signal. In the region B to the region F, in the similar manner, the configuration is such that a phase of a zero vector becomes different between a maximum point of the carrier signal and a minimum point of the carrier signal.

Figure 9:
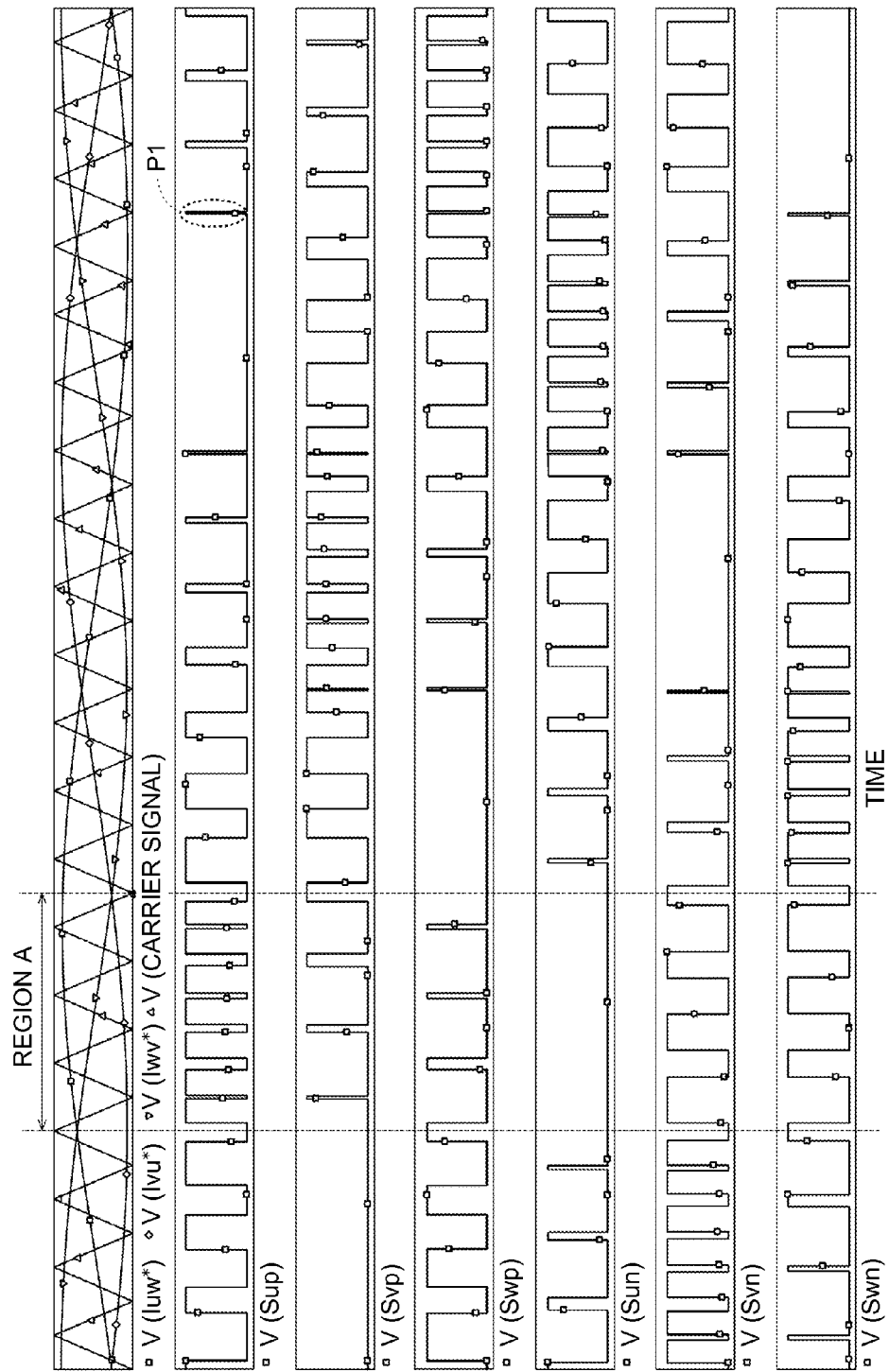
FIG. 9 is a diagram illustrating switch drive signals of the current-source power converting apparatus according to the first embodiment.
Figure 10:
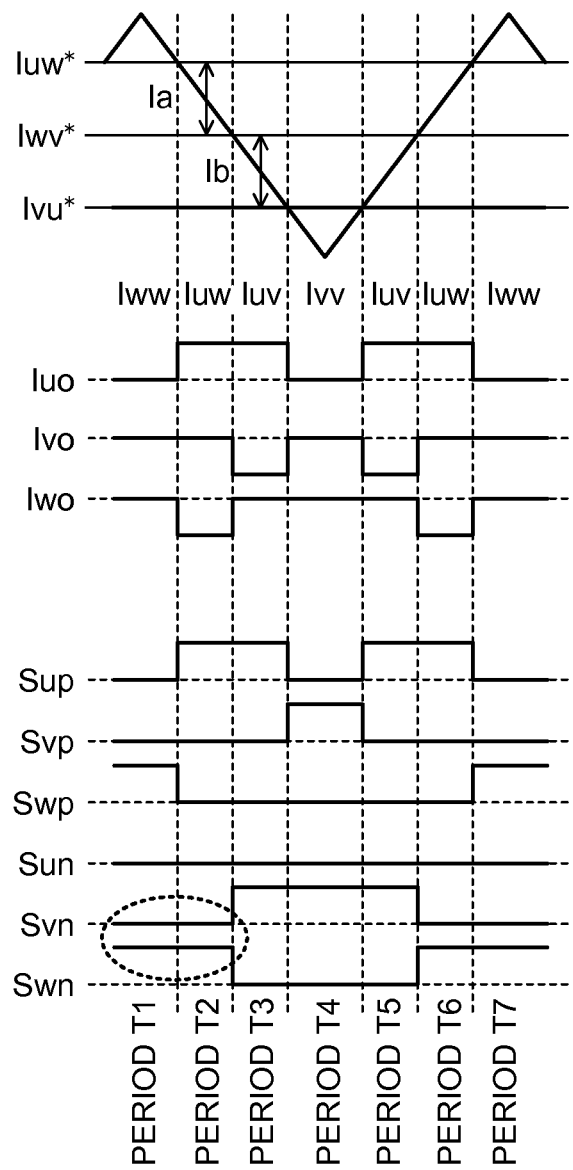
FIG. 10 is an enlarged view of the switch drive signals shown in FIG. 9.

FIG. 9 illustrates an example of the carrier signal (carrier) and the line-to-line current references Iuw*, Ivu*, and Iwv*, and the switch drive signals Sup, Sun, Svp, Svn, Swp, and Swn. Moreover, FIG. 10 illustrates the switch drive signals Sup, Sun, Svp, Svn, Swp, and Swn in the region A in FIG. 8 (part of the region A in FIG. 9) in an enlarged manner. Moreover, FIG. 10 illustrates currents Iuo, Ivo, and Iwo of three phases that are generated based on on/off (High and Low) of the switch drive signals Sup, Sun, Svp, Svn, Swp, and Swn and are output to the load side. In FIG. 9 and FIG. 10, delay in turn-off of switch drive signals by the off delay circuits 35 to 40 is omitted.

As shown in FIG. 10, a phase of an output current vector changes in order of Iww, Iuw, Iuv, Ivv, Iuv, Iuw, and Iww in a period T1 to a period T7. In other words, a phase of a zero vector changes in order of Iww, Ivv, and Iww, and a phase of a zero vector is different between the period T1, the period T7, and the period T4.

Switch drive signals when a phase of a zero vector does not change are explained with reference to a comparison example shown in FIG. 11. Whereas two different zero vectors (Iww and Ivv) are used in the period T1 to the period T7 in the example shown in FIG. 10, one zero vector (Ivv) is used in the period T1 to the period T7 in the comparison example shown in FIG. 11.

Figure 11:
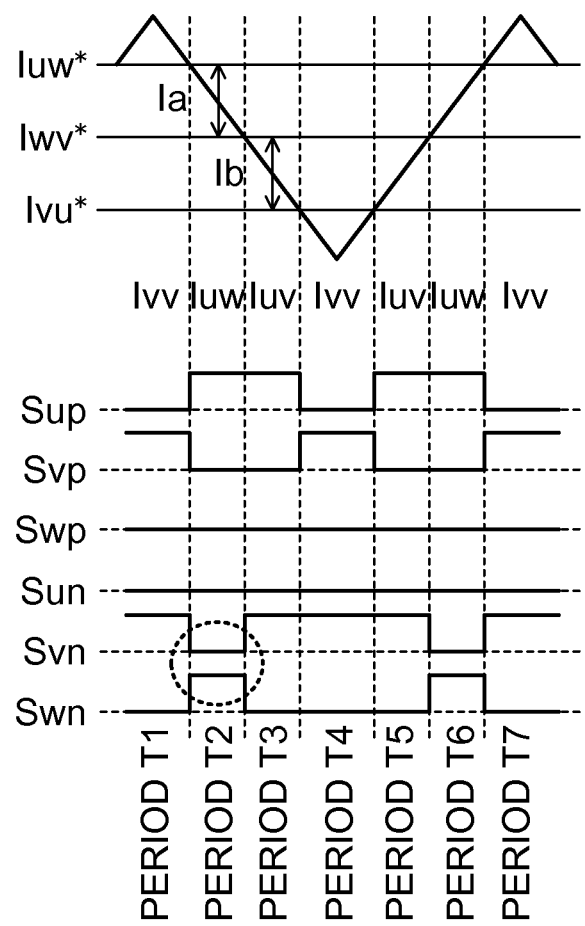
FIG. 11 is a diagram illustrating switch drive signals in a comparison example.

As shown in FIG. 11, when using one type of a zero-current vector during one cycle of a PWM carrier, a phase of an output current vector changes in order of Ivv, Iuw, Iuv, Ivv, Iuv, Iuw, and Ivy in the period T1 to the period T7. In other words, all phases of a zero vector, which is a current vector in the period T1, the period T7, and the period T4, are one type of the zero-current vector Ivv. Therefore, for example, on/off of the switch drive signals Svn and Swn is switched before and after the period T2 as shown in FIG. 11, so that the width in which the switch drive signal Svn is off and the width (portion surrounded by a dotted circle in FIG. 11) in which the switch drive signal Swn is on are only the width for the period T2. Consequently, the width of a signal of the portion surrounded by the dotted circle in FIG. 11 becomes relatively short. In other words, in the comparison example shown in FIG. 11, Iuw* and Iwv* become approximately the same value and, in the case where Ia is small, a pulse of a switch drive signal having a short width becomes easy to generate. On the other hand, in the example shown in FIG. 10, the switch drive signals Svn and Swn do not change from the period T1 to the period T2, so that the width (portion surrounded by a dotted circle in FIG. 10) of the switch drive signals Svn and Swn has a width for the total period of the period T1 and the period T2. Consequently, the width of a signal of the portion surrounded by the dotted circle in FIG. 10 does not become short. In other words, in the example shown in FIG. 10, a short pulse is not easily generated. Generation of a short pulse can be prevented in output near a zero current by appropriately setting an order of current vectors by using two types of zero-current vectors during one cycle of a PWM carrier according to a current phase in this manner.

As described above, the current-source power converting apparatus 100 in the first embodiment includes the logic circuit 34 that generates drive signals of the switching elements 18 to 23 based on the PWM pulse signals Suw, Svu, and Swv and the polarities of the phase current references Iu*, Iv*, and Iw*. The logic circuit 34 performs an AND operation of the PWM pulse signals Suw, Svu, and Swv and the polarities of the phase current references Iu*, Iv*, and Iw* to generate the switch drive signals Sup*, Sun*, Svp*, Svn*, Swp*, and Swn* that generate both vectors, whose magnitude is not zero in one cycle of a PWM carrier, and zero vectors, so that it is not needed to provide a circuit for monitoring a state of outputting a zero vector and a D flip-flop circuit for generating a signal that sets the switching elements 18 to 23 to an on-state. Consequently, it is possible to suppress generation of a pulse (glitch) having a relatively short width due to signal delay while passing these circuits. As a result, distortion of an output current due to generation of a glitch because of a propagation delay time difference can be suppressed.

Moreover, in the first embodiment, as described above, the logic circuit 34 is configured such that, when outputting drive signals of the switching elements 18 to 23 based on an AND operation of the PWM pulse signals Suw, Svu, and Swv and the polarities of the phase current references Iu*, Iv*, and Iw*, a phase of a zero vector is selected and output to suppress the width of the drive signals of the switching elements 18 to 23 from becoming short. Consequently, the width of the drive signals of the switching elements 18 to 23 can be suppressed from becoming short easily.

Moreover, in the first embodiment, the switch drive signals Sup*, Sun*, Svp*, Svn*, Swp*, and Swn*, which generate both vectors, whose magnitude is not zero in one cycle of a PWM carrier, and zero vectors, are generated based on polarities of phase current references. Consequently, generation of a short pulse can be prevented in output near a zero current.

In the above example, the logic circuit 34 is explained to perform an AND operation of the PWM pulse signals Suw, Svu, and Swv and the polarities of the phase current references Iu*, Iv*, and Iw*, however, the drive-signal generating unit that generates switch drive signals is not limited to the logic circuit 34. For example, it is possible to configure a drive-signal generating unit that selects and outputs signals based on PWM pulse signals as switch drive signals based on the polarities of the phase current references Iu*, Iv*, and Iw* without using a logic circuit.

In the above example, the logic circuit 34 is configured to generate drive signals of the switching elements 18 to 23 based on an AND operation of two PWM pulse signals, which are different from each other, among three PWM pulse signals Suw, Svu, and Swv and polarities of two phase current references among the phase current references Iu*, Iv*, and Iw*. Consequently, the logic circuit 34 can easily generate drive signals of the switching elements 18 to 23 by two PWM pulse signals, which are different from each other, and the polarities of the phase current references Iu*, Iv*, and Iw* without providing a circuit, which monitors a magnitude of a carrier signal, and a D flip-flop circuit.

In the above embodiment, the logic circuit 34 generates drive signals of the switching elements 18 to 23 based on an AND operation of two PWM pulse signals and polarities of two phase current references as an example, however, the configuration of the logic circuit 34 is not limited to this. For example, it is possible to use a logic circuit that selects and outputs one signal from among a plurality of signals based on two PWM pulse signals as a switch drive signal, based on polarities of three phase current references. Moreover, for example, it is possible to use a logic circuit that selects and outputs one signal from among a plurality of signals based on three PWM pulse signals as a switch drive signal, based on polarities of three phase current references.

(Second Embodiment)

In this second embodiment, a logic circuit is configured to output a switch drive signal based on an AND operation of PWM pulse signals and phase-current polarity signals generated based on line-to-line current references to which offset is added. In the second embodiment, a short pulse generated when a modulation factor (value of the current reference vector Iout_r) is small is suppressed in addition to suppression of a glitch generated due to delay of a logic circuit.

When the current reference vector Iout_r becomes small and the magnitude of the vectors Ia and Ib approaches near zero, in the above first embodiment shown in FIG. 10, the width of the switch drive signal Sup in the period T2 and the period T3 (the period T5 and the period T6) also approaches near zero to become a short pulse. The lower limit of a time width in which a switching element can output is determined depending on turn-on time and turn-off time of the switching element and a transmission time of a switch drive signal. Therefore, when a switch drive signal is a short pulse, at the time of a low current reference, a switching element is not turned on in some cases.

Figure 18:
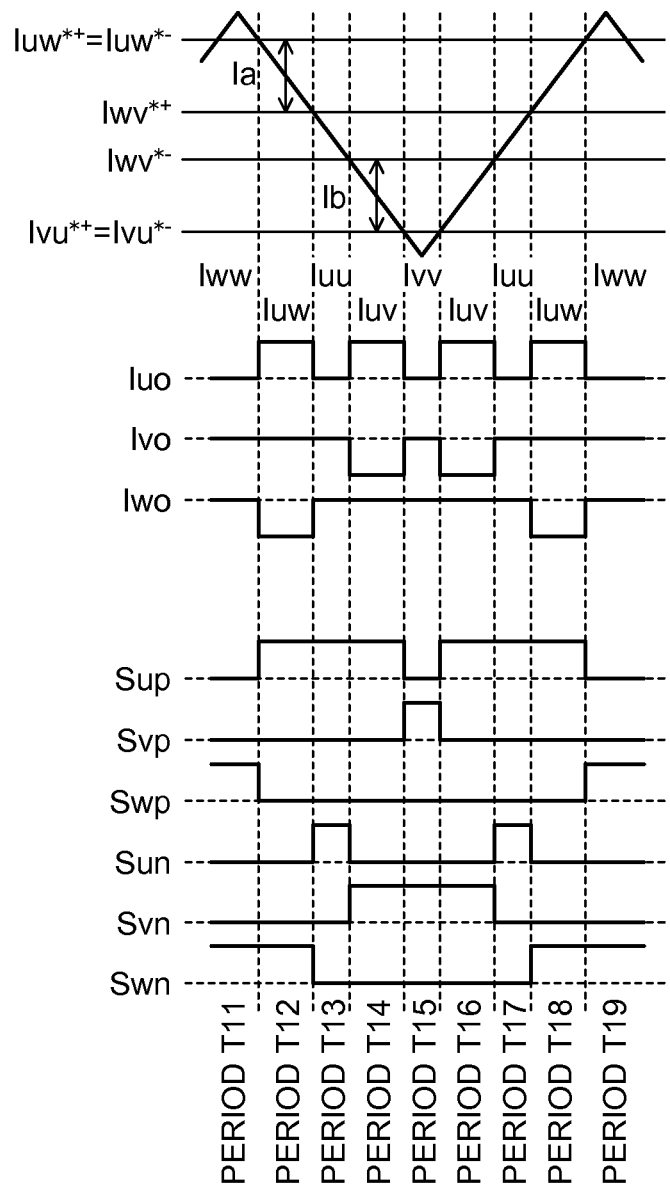
FIG. 18 is an enlarged view of the switch drive signals shown in FIG. 17.

Thus, in a current-source power converting apparatus in the second embodiment, a period during which a zero-current vector is output is further increased to switch to pulses as shown in FIG. 18. The pulses are generated by adding offset to a current reference so that a period of outputting a zero-current vector increases at the time of outputting low current and low voltage. Consequently, in the current-source power converting apparatus in the second embodiment, as shown in FIG. 18, the zero vector Iuu is output in the period T13 and the period T17. Therefore, even when the current reference vector Iout_r becomes small, the width of the switch drive signal Sup in the period T12 to the period T14 (the period T16 to the period T18) increases for the time in which the zero vector Iuu is output (generation of a short pulse is suppressed). The time in which the zero vector Iuu is output can be set to a setting time obtained by adding a predetermined margin to the lower limit. The offset voltage is set so that the time can be ensured.

A current-source power converting apparatus 101 according to the second embodiment is specifically explained below with reference to FIG. 12 to FIG. 16. Components corresponding to those in the above first embodiment are denoted by the same reference numerals, and explanation overlapping the first embodiment is appropriately omitted.

Figure 12:
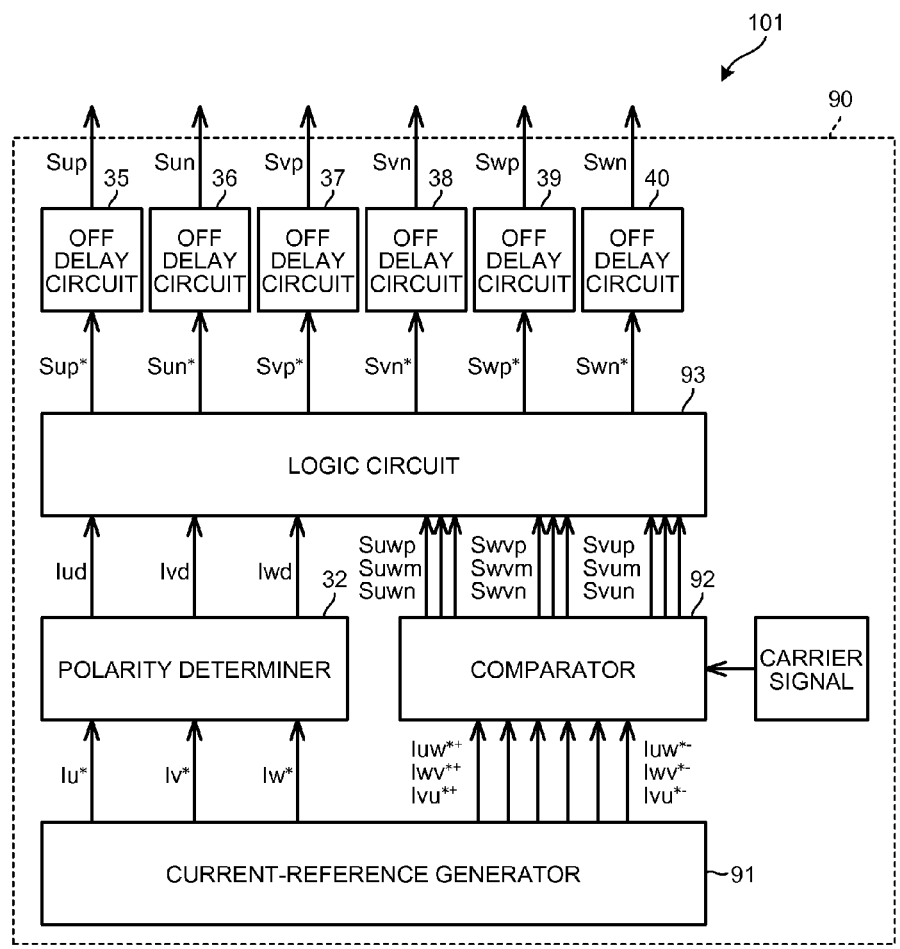
FIG. 12 is a block diagram of a current-source power converting apparatus according to a second embodiment.

As shown in FIG. 12, a switch-signal generating unit 90 in the current-source power converting apparatus 101 according to the second embodiment includes a current-reference generator 91, the polarity determiner 32, a comparator 92, a logic circuit 93, and the six off delay circuits 35 to 40. The current-reference generator 91 is an example of a "current-reference generating unit". The logic circuit 93 is an example of a "drive-signal generating unit". The comparator 92 is an example of a "PWM-pulse-signal generating unit".

Next, each component of the switch-signal generating unit 90 is explained in detail.

As shown in FIG. 12, in the second embodiment, the current-reference generator 91 is configured to output the phase current references Iu*, Iv*, and Iw* and line-to-line current references Iuw*+, Iwv*+, Ivu*+, Iuw*−, Iwv*−, and Ivu*− in parallel. The line-to-line current references Iuw*+, Iwv*+, Ivu*+, Iuw*−, Iwv*−, and Ivu*− are generated by adding or subtracting offset ΔIoffset to or from the line-to-line current references Iuw*, Ivu*, and Iwv* (see FIG. 7) in the first embodiment. When a line-to-line current reference having the largest value, a line-to-line current reference having the smallest value, and a line-to-line current reference having a medium value, among three line-to-line current references Iuw*, Ivu*, and Iwv* are Imax*, Imin*, and Imid*, line-to-line current references Imax*+, Imax*−, Imid*+, Imid*−, Imin*+, and Imin*− obtained by correcting these values are expressed by the following Equation (6) to Equation (9).

$$Imax^{*+}=Imax^{*-}=Imax^{*}+\Delta Ioffset \quad (6)$$

$$Imid^{*+}=Imid^{*}+\Delta Ioffset \quad (7)$$

$$Imid^{*-}=Imid^{*}-\Delta Ioffset \quad (8)$$

$$Imin^{*+}=Imin^{*}=Imin^{*}-\Delta Ioffset \quad (9)$$

Each of Imax*+, Imax*−, Imid*+, Imid*−, Imin*+, and Imin*− corresponds to any of the line-to-line current references Iuw*+, Iwv*+, Ivu*+, Iuw*−, Iwv*−, and Ivu*− according to a phase.

Figure 13:
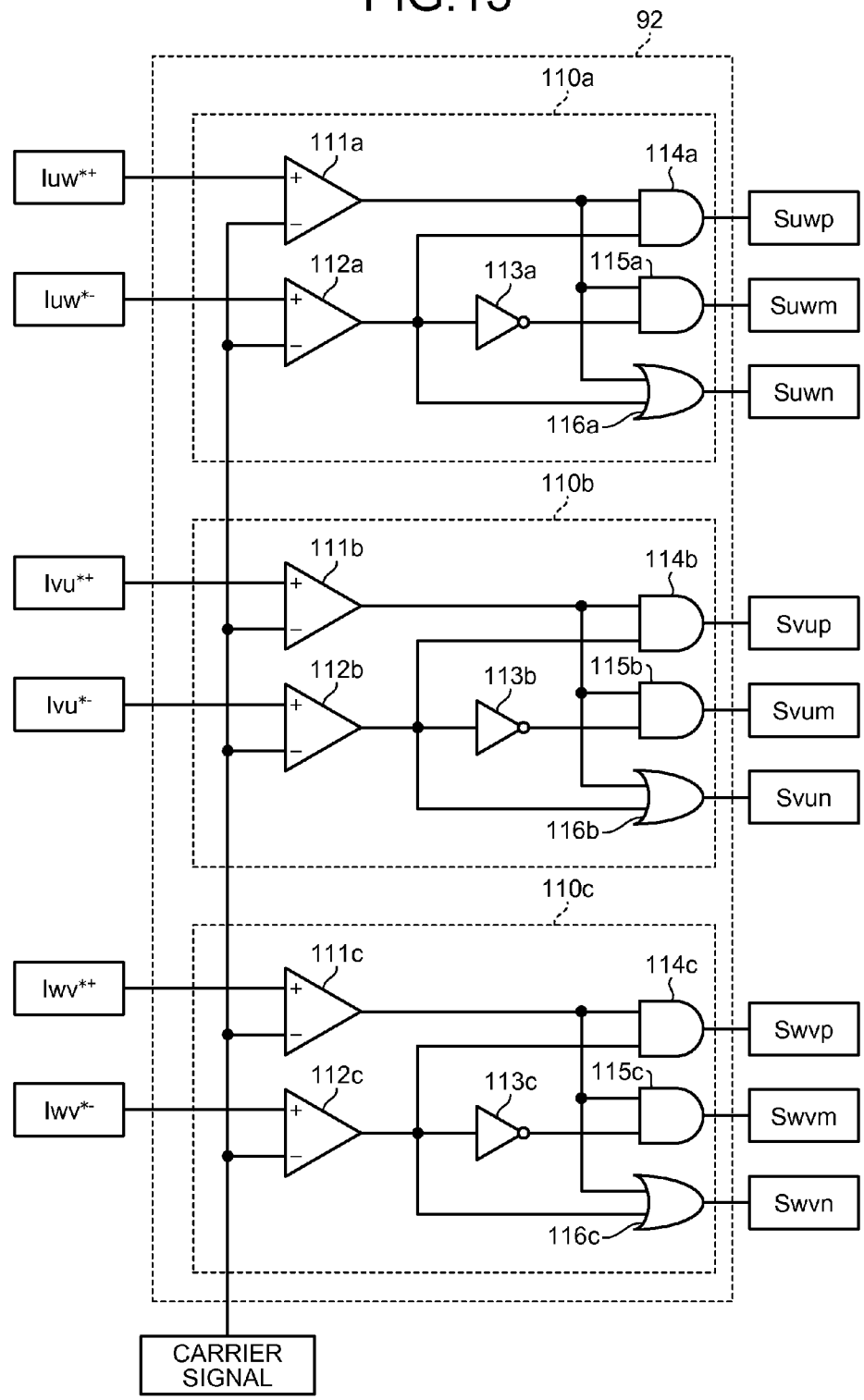
FIG. 13 is a circuit diagram of a comparator of the current-source power converting apparatus according to the second embodiment.

As shown in FIG. 13, the comparator 92 includes a first comparing unit 110a, a second comparing unit 110b, and a third comparing unit 110c. Moreover, the first comparing unit 110a includes two comparators 111a and 112a, a NOT circuit 113a, two AND circuits 114a and 115a, and an OR circuit 116a. The comparator 111a of the first comparing unit 110a is configured such that the line-to-line current reference Iuw*+ and the carrier signal (carrier) are input thereto. The comparator 112a is configured such that the line-to-line current reference Iuw*− and the carrier signal are input. The comparator 111a is connected to the AND circuit 114a, the AND circuit 115a, and the OR circuit 116a. The comparator 112a is connected to the AND circuit 114a, the NOT circuit 113a, and the OR circuit 116a. The NOT circuit 113a is connected to the AND circuit 115a. The AND circuit 114a, the AND circuit 115a, and the OR circuit 116a are configured to output PWM pulse signals Suwp, Suwm, and Suwn, respectively.

Moreover, the configuration of the second comparing unit 110b (comparators 111b and 112b, NOT circuit 113b, AND circuits 114b and 115b, and OR circuit 116b) is similar to the first comparing unit 110a. The AND circuit 114b, the AND circuit 115b, and the OR circuit 116b are configured to output PWM pulse signals Svup, Svum, and Svun, respectively. The configuration of the third comparing unit 110c (comparators 111c and 112c, NOT circuit 113c, AND circuits 114c and 115c, and OR circuit 116c) is also similar to the first comparing unit 110a. The AND circuit 114c, the AND circuit 115c, and the OR circuit 116c are configured to output PWM pulse signals Swvp, Swvm, and Swvn, respectively.

Figure 14:
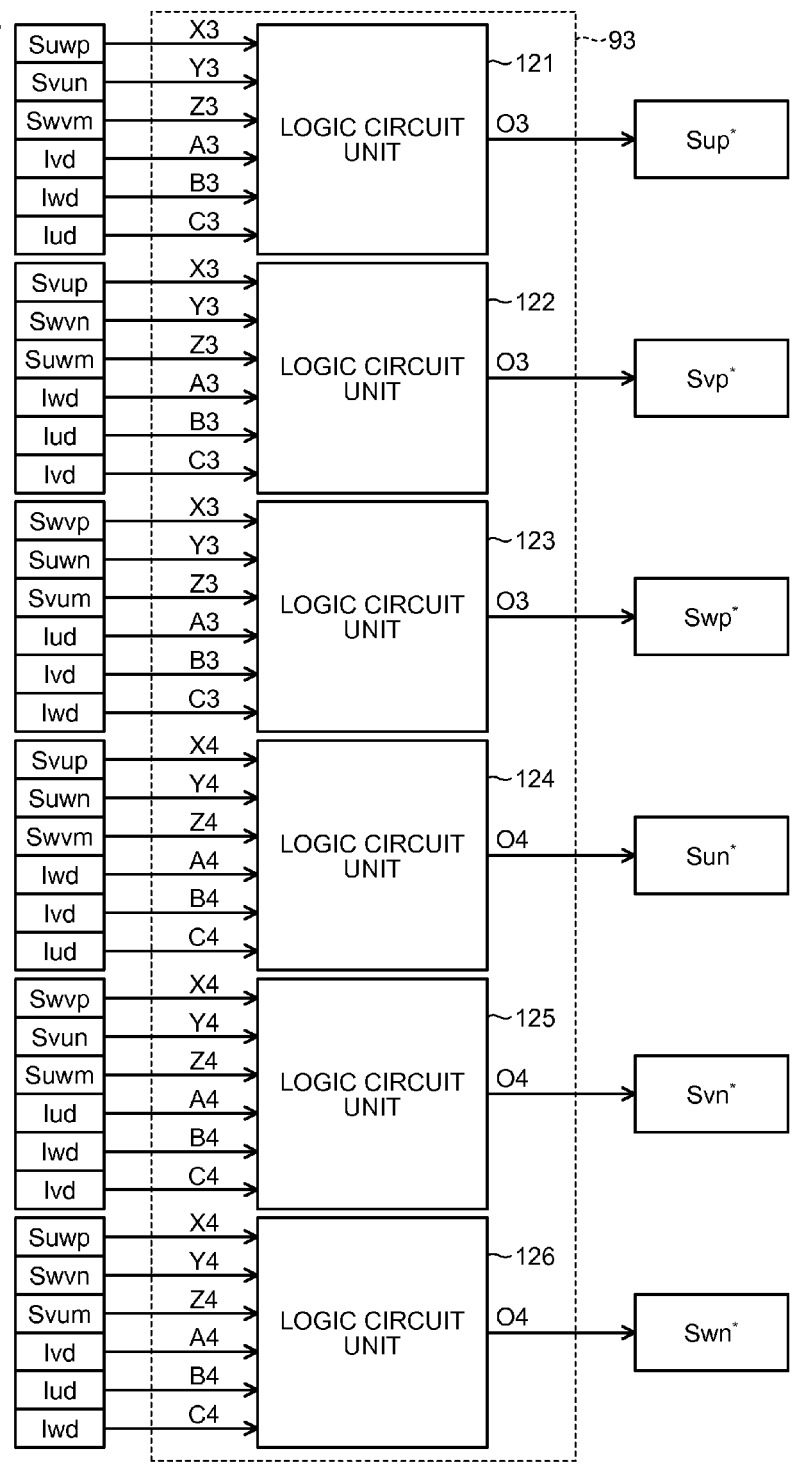
FIG. 14 is a block diagram of a logic circuit of the current-source power converting apparatus according to the second embodiment.

As shown in FIG. 14, the logic circuit 93 includes six logic circuit units 121 to 126. In the second embodiment, the logic circuit 93 (logic circuit units 121 to 126) is configured to output the switch drive signals Sup*, Sun*, Svp*, Svn*, Swp*, and Swn* based on an AND operation of three PWM pulse signals among nine PWM pulse signals Suwp, Suwm, Suwn, Svup, Svum, Svun, Swvp, Swvm, and Swvn and the phase-current polarity signals Iud, Ivd, and Iwd of three phases. In the similar manner to the first embodiment, the switch drive signals Sup* and Sun* are switch drive signals that drive the switching element 18 on a positive side of the U-phase and the switching element 19 on a negative side of the U-phase, respectively. The switch drive signals Svp* and Svn* are switch drive signals that drive the switching element 20 on a positive side of the V-phase and the switching element 21 on a negative side of the V-phase, respectively. The switch drive signals Swp* and Swn* are switch drive signals that drive the switching element 22 on a positive side of the W-phase and the switching element 23 on a negative side of the W-phase, respectively.

The switch drive signal Sup*, which drives the switching element 18 on a positive side of the U-phase, is generated by the logic circuit unit 121 using the PWM pulse signals Suwp and Svun relating to the U-phase, the PWM pulse signal Swvm, which is not relating to the U-phase and corresponds to a line-to-line current reference having a medium magnitude, and all of the three phase-current polarity signals Ivd, Iwd, and Iud. In the similar manner, the switch drive signals Sun*, Svp*, Svn*, Swp*, and Swn* are generated by the logic circuit units 122 to 126 using two PWM pulse signals relating to a phase of a switch drive signal, a PWM pulse signal, which is not relating to a phase of a switch drive signal and corresponds to a line-to-line current reference having a medium magnitude, and all of the three phase-current polarity signals.

Figure 15:
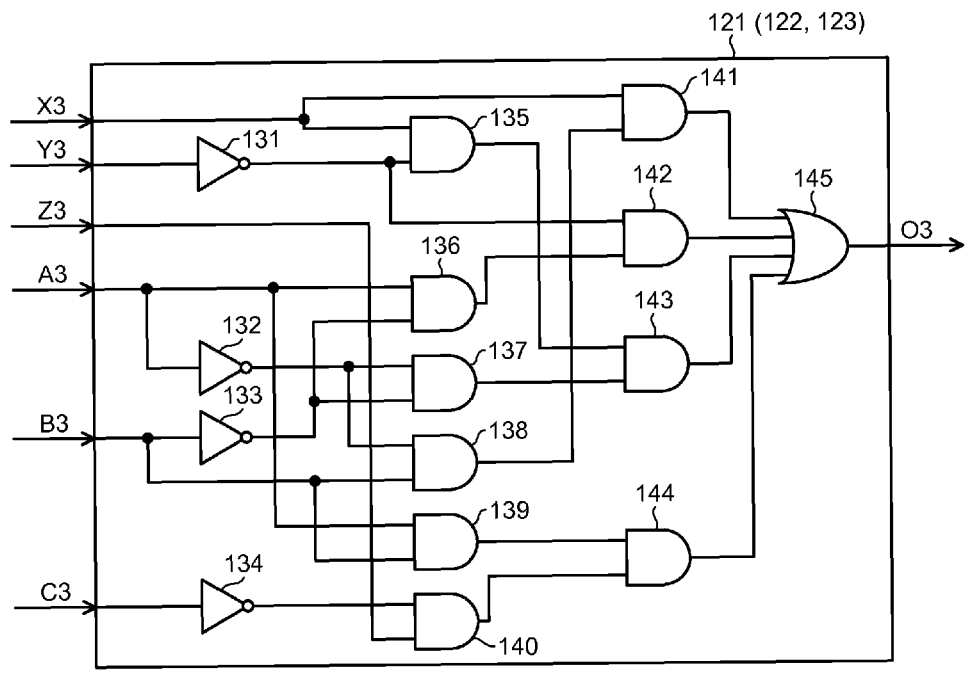
FIG. 15 is a circuit diagram of a logic circuit unit that generates a switch drive signal of a switching element on a positive terminal side of the current-source power converting apparatus according to the second embodiment.

The internal logic of the logic circuit units 121 to 123 is expressed by the following Equation (10) and is realized by a logic circuit shown in FIG. 15. The internal logic of the logic circuit units 124 to 126 is expressed by the following Equation (11) and is realized by a logic circuit shown in FIGS. 16.

X3, Y3, and Z3 are switch drive signals input to the logic circuit units 121 to 123 that drive positive-side switching elements of respective phases. A3, B3, and C3 are phase-current polarity signals input to the logic circuit units 121 to 123 that drive positive-side switching elements of respective phases. X4, Y4, and Z4 are switch drive signals input to the logic circuit units 124 to 126 that drive negative-side switching elements of respective phases. A4, B4, and C4 are phase-current polarity signals input to the logic circuit units 124 to 126 that drive negative-side switching elements of respective phases. O3 is switch drive signals (Sup*, Svp*, and Swp*) on a positive side output from the logic circuit units 121 to 123. O4 is switch drive signals (Sun*, Svn*, and Swn*) on a negative side output from the logic circuit units 124 to 126.

The process content in Equations (10) and (11) is processed in the similar manner to Equations (4) and (5) in the first embodiment. For example, the process of the logic circuit unit 121 is explained with reference to FIG. 14 and Equation (10). In the first term on the right-hand side of Equation (10), when the phase-current polarity signal A3 (Ivd) is Low and the phase-current polarity signal B3 (Iwd) is High, the switch drive signal O3 (Sup*) is X3 (Suwp). In the second term on the right-hand side, when the phase-current polarity signal A3 (Ivd) is High and the phase-current polarity signal B3 (Iwd) is Low, the switch drive signal O3 (Sup*) is an inversion signal of Y3 (Svun). In the third term on the right-hand side, when the phase-current polarity signal A3 (Ivd) is Low and the phase-current polarity signal B3 (Iwd) is Low, the switch drive signal O3 (Sup*) is an AND signal of X3 (Suwp) and inverted Y3 (Svun). In the fourth term on the right-hand side, when the phase-current polarity signal A3 (Ivd) is High, the phase-current polarity signal B3 (Iwd) is High, and the phase-current polarity signal C3 (Iud) is Low, the switch drive signal O3 (Sup*) is Z3 (Suwm).

$$O3 = \overline{A3} \cdot B3 \cdot X3 + A3 \cdot \overline{B3} \cdot \overline{Y3} + \overline{A3} \cdot \overline{B3} \cdot X3 \cdot \overline{Y3} + A3 \cdot B3 \cdot \overline{C3} \cdot Z3 \quad (10)$$

$$O4 = A4 \cdot \overline{B4} \cdot X4 + \overline{A4} \cdot B4 \cdot \overline{Y4} + A4 \cdot B4 \cdot X4 \cdot \overline{Y4} + \overline{A4} \cdot \overline{B4} \cdot C4 \cdot Z4 \quad (11)$$

As shown in FIG. 15, the logic circuit units 121 to 123 each include four NOT circuits 131 to 134, ten AND circuits 135 to 144, and an OR circuit 145. The signal X3 input to the logic circuit units 121 to 123 is input to the AND circuit 135 and the AND circuit 141. The signal Y3 is input to the NOT circuit 131. The signal Z3 is input to the AND circuit 140. The signal A3 is input to the AND circuit 136, the NOT circuit 132, and the AND circuit 139. The signal B3 is input to the NOT circuit 133, the AND circuit 138, and the AND circuit 139. The signal C3 is input to the NOT circuit 134.

The output side of the NOT circuit 131 is connected to the input sides of the AND circuit 135 and the AND circuit 142. The output side of the NOT circuit 132 is connected to the input sides of the AND circuit 137 and the AND circuit 138. The output side of the NOT circuit 133 is connected to the input sides of the AND circuit 136 and the AND circuit 137. The output side of the NOT circuit 134 is connected to the input side of the AND circuit 140.

The output side of the AND circuit 135 is connected to the input side of the AND circuit 143. The output side of the AND circuit 136 is connected to the input side of the AND circuit 142. The output side of the AND circuit 137 is connected to the input side of the AND circuit 143. The output side of the AND circuit 138 is connected to the input side of the AND circuit 141. The output side of the AND circuit 139 is connected to the input side of the AND circuit 144. The output side of the AND circuit 140 is connected to the input side of the AND circuit 144. The output sides of the AND circuits 141 to 144 are connected to the input side of the OR circuit 145.

Figure 16:
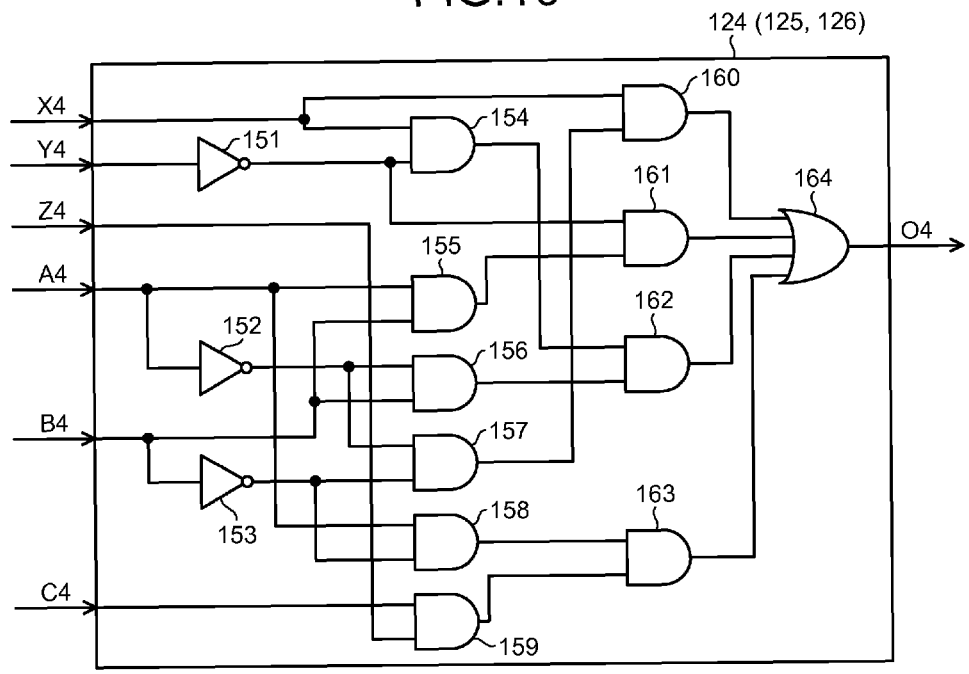
FIG. 16 is a circuit diagram of a logic circuit unit that generates a switch drive signal of a switching element on a negative terminal side of the current-source power converting apparatus according to the second embodiment.

As shown in FIG. 16, the logic circuit units 124 to 126 each include three NOT circuits 151 to 153, ten AND circuits 154 to 163, and an OR circuit 164. The signal X4 input to the logic circuit units 124 to 126 is input to the AND circuit 154 and the AND circuit 160. The signal Y4 is input to the NOT circuit 151. The signal Z4 is input to the AND circuit 159. The signal A4 is input to the AND circuit 155, the AND circuit 158, and the NOT circuit 152. The signal B4 is input to the AND circuit 155, the AND circuit 156, and the NOT circuit 153. The signal C4 is input to the AND circuit 159.

The output side of the NOT circuit 151 is connected to the input sides of the AND circuit 154 and the AND circuit 161. The output side of the NOT circuit 152 is connected to the input sides of the AND circuit 156 and the AND circuit 157. The output side of the NOT circuit 153 is connected to the input sides of the AND circuit 157 and the AND circuit 158.

The output side of the AND circuit 154 is connected to the input side of the AND circuit 162. The output side of the AND circuit 155 is connected to the input side of the AND circuit 161. The output side of the AND circuit 156 is connected to the input side of the AND circuit 162. The output side of the AND circuit 157 is connected to the input side of the AND circuit 160. The output side of the AND circuit 158 is connected to the input side of the AND circuit 163. The output side of the AND circuit 159 is connected to the input side of the AND circuit 163. The output sides of the AND circuits 160 to 163 are connected to the input side of the OR circuit 164.

Then, as shown in FIG. 14, the six logic circuit units 121 to 126 are configured to output the switch drive signals Sup*, Svp*, Swp*, Sun*, Svn*, and Swn*, respectively. Moreover, the switch drive signals Sup*, Sun*, Svp*, Svn*, Swp*, and Swn* are input to the off delay circuits 35 to 40 and are output from the off delay circuits 35 to 40 as the switch drive signals Sup, Sun, Svp, Svn, Swp, and Swn, respectively.

An order of current vectors output in the regions A to F (see FIG. 8) in a spatial vector diagram by the current-source power converting apparatus 101 is expressed as follows. Each of the regions A to F uses three types of zero-current vectors (Iuu, Ivv, and Iww).

| | |
|---|---|
| $Iww \to Iuw \to Iuu \to Iuv \to Ivv \to Iuv \to Iuu \to Iuw \to Iww$ | (region A) |
| $Iuu \to Iuw \to Iww \to Ivw \to Ivv \to Ivw \to Iww \to Iuw \to Iuu$ | (region B) |
| $Iuu \to Ivu \to Ivv \to Ivw \to Iww \to Ivw \to Ivv \to Ivu \to Iuu$ | (region C) |
| $Ivv \to Ivu \to Iuu \to Iwu \to Iww \to Iwu \to Iuu \to Ivu \to Ivv$ | (region D) |
| $Ivv \to Iwv \to Iww \to Iwu \to Iuu \to Iwu \to Iww \to Iwv \to Ivv$ | (region E) |
| $Iww \to Iwv \to Ivv \to Iuv \to Iuu \to Iuv \to Ivv \to Iwv \to Iww$ | (region F) |

The current-source power converting apparatus 101 in the second embodiment is configured such that a zero vector is output even between a maximum point of the carrier signal and a minimum point of the carrier signal, different from the current-source power converting apparatus 100 in the first embodiment in which a zero vector is output only near a maximum point of the carrier signal or near a minimum point of the carrier signal. For example, in the region A, the current-source power converting apparatus 101 in the second embodiment is configured to select and output a zero vector in order of Iww (carrier signal is near a maximum point), Iuu (carrier signal is between a maximum point and a minimum point), Ivv (carrier signal is near a minimum point), Iuu (carrier signal is between a maximum point and a minimum point), and Iww (carrier signal is near a maximum point). Other configurations of the second embodiment are similar to the first embodiment.

Figure 17:
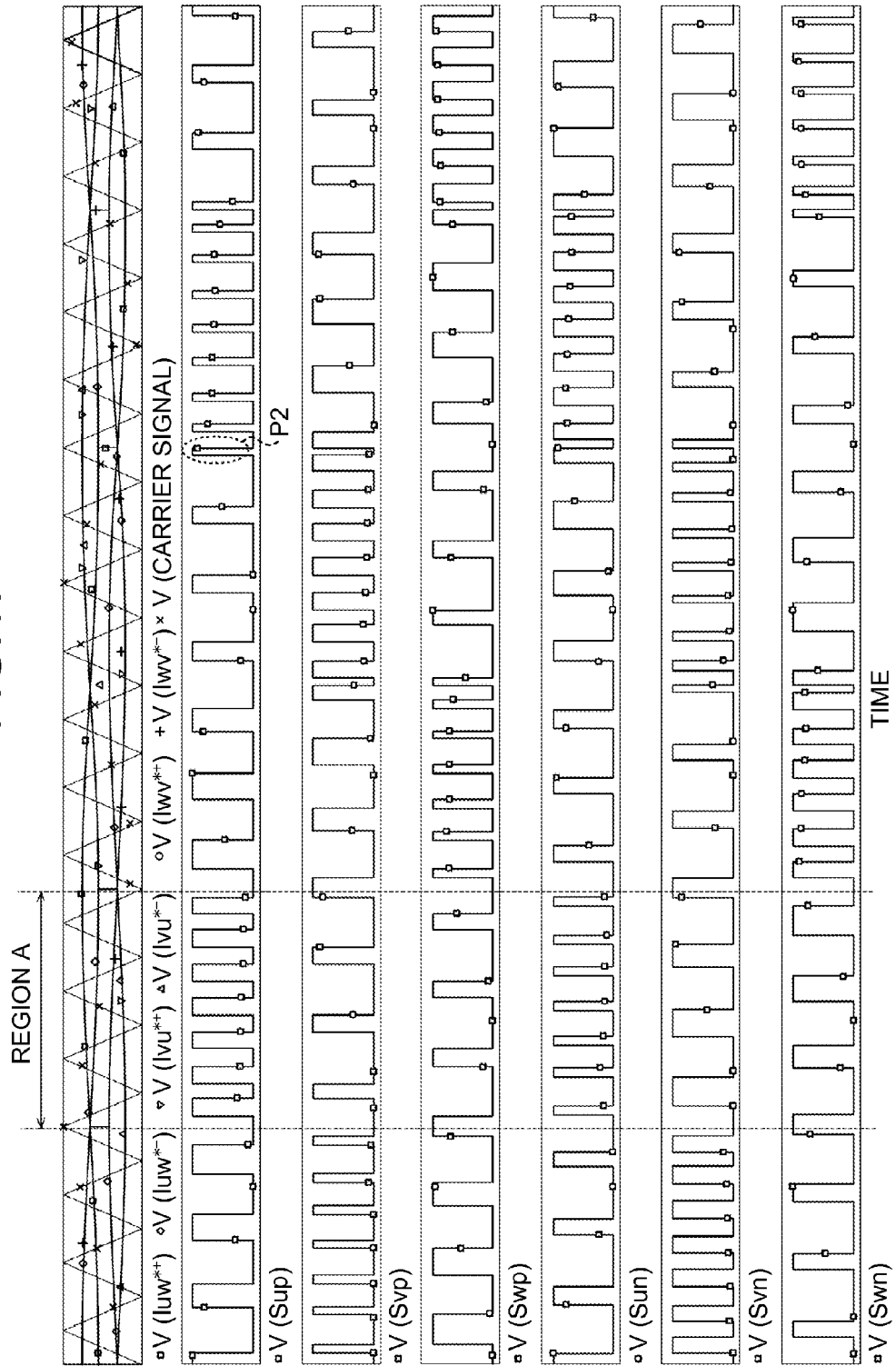
FIG. 17 is a diagram illustrating switch drive signals of the current-source power converting apparatus according to the second embodiment.

FIG. 17 illustrates the carrier signal (carrier) and the line-to-line current references Iuw*+, Iwv*+, Ivu*+, Iuw*−, Iwv*−, and Ivu*−, and the switch drive signals Sup, Sun, Svp, Svn, Swp, and Swn generated by comparison of the carrier signal and the line-to-line current references Iuw*+, Iwv*+, Ivu*+, Iuw*−, Iwv*−, and Ivu*−. FIG. 18 illustrates the switch drive signals Sup, Sun, Svp, Svn, Swp, and Swn in the region A (part of the region A in FIG. 17) in FIG. 8 in an enlarged manner.

As shown in FIG. 18, a phase of an output current vector changes in order of Iww, Iuw, Iuu, Iuv, Ivv, Iuv, Iuu, Iuw, and Iww in a period T11 to a period T19. When the current reference vector Iout_r becomes small and the magnitude of the vectors Ia and Ib approaches near zero, in the example of the above first embodiment shown in FIG. 10, the width of the switch drive signal Sup in the period T2 and the period T3 (the period T5 and the period T6) also approaches near zero. Therefore, a pulse by the switch drive signal Sup is not actually output due to characteristics such as switching delay time. On the other hand, in the second embodiment shown in FIG. 18, because the zero vector Iuu is output even in the period T13 and the period T17, even when the current reference vector Iout_r becomes small, the width of the switch drive signal Sup in the period T12 to the period T14 and the period T16 to the period T18 increases for the time in which the zero vector Iuu is output (generation of a short pulse is suppressed). The time in which the zero vector Iuu is output is adjusted by the offset ΔIoffset by Equation (6) to Equation (9).

In the second embodiment, as above, the current-reference generator 91 is configured to output the line-to-line current references Iuw*+, Iwv*+, Ivu*+, Iuw*−, Iwv*−, and Ivu*−, to which offset is added, according to a mutual magnitude relationship of the line-to-line current references Iuw*, Iwv*, and Ivu*. Moreover, the comparator 92 is configured to generate nine PWM pulse signals Suwp, Suwm, Suwn, Svup, Svum, Svun, Swvp, Swvm, and Swvn by comparison of six line-to-line current references Iuw*+, Iwv*+, Ivu*+, Iuw*−, Iwv*−, and Ivu*− and the carrier signal. The logic circuit 93 is configured to generate the switch drive signals Sup, Sun, Svp, Svn, Swp, and Swn based on an AND operation of three PWM pulse signals and polarities of phase current references. Consequently, it is possible to output a zero vector even between a maximum point of the carrier signal and a minimum point of the carrier signal in addition to near a maximum point of the carrier signal and near a minimum point of the carrier signal. As a result, even when the current reference vector Iout_r becomes small, the width of a switch drive signal increases for the time of a zero vector output between a maximum point of the carrier signal and a minimum point of the carrier signal. Thus, even when a modulation factor (value of the current reference vector Iout_r) is small, the width of a pulse can be increased.

(Third Embodiment)

A current-source power converting apparatus in this third embodiment includes a zero-vector locking circuit 170 that locks a phase of a zero vector when a zero vector is output. The current-source power converting apparatus in the third embodiment suppresses a short pulse generated when a modulation factor (value of the current reference vector Iout_r) is large. The third embodiment can be applied to the first embodiment and the second embodiment. Therefore, when the third embodiment is applied to the first embodiment, a short pulse generated when a modulation factor (value of the current reference vector Iout_r) is large can be suppressed in addition to suppression of a glitch generated due to delay of a signal process of a logic circuit (effect by the first embodiment). Moreover, when the third embodiment is applied to the second embodiment, a short pulse generated when a modulation factor is large can be suppressed in addition to suppression of a glitch generated due to delay of a signal process of a logic circuit (effect by the first embodiment) and suppression of a short pulse generated when a modulation factor is small (effect by the second embodiment).

The current-source power converting apparatus in the third embodiment may be configured to be capable of switching between a case where the zero-vector locking circuit is driven and a case where the zero-vector locking circuit is not driven according to the magnitude of a line-to-line current reference. When the value of the current reference vector Iout_r is small, the width of an effective vector (vector other than a zero vector) becomes small in some cases by a phase of a zero vector being locked. Therefore, when the value of the current reference vector Iout_r is small, an enable signal to be described later is controlled so that the zero-vector locking circuit is not driven. Consequently, the width of an effective vector can be suppressed from becoming small.

A current-source power converting apparatus 102 according to the third embodiment is specifically explained below with reference to FIG. 19.

Figure 19:
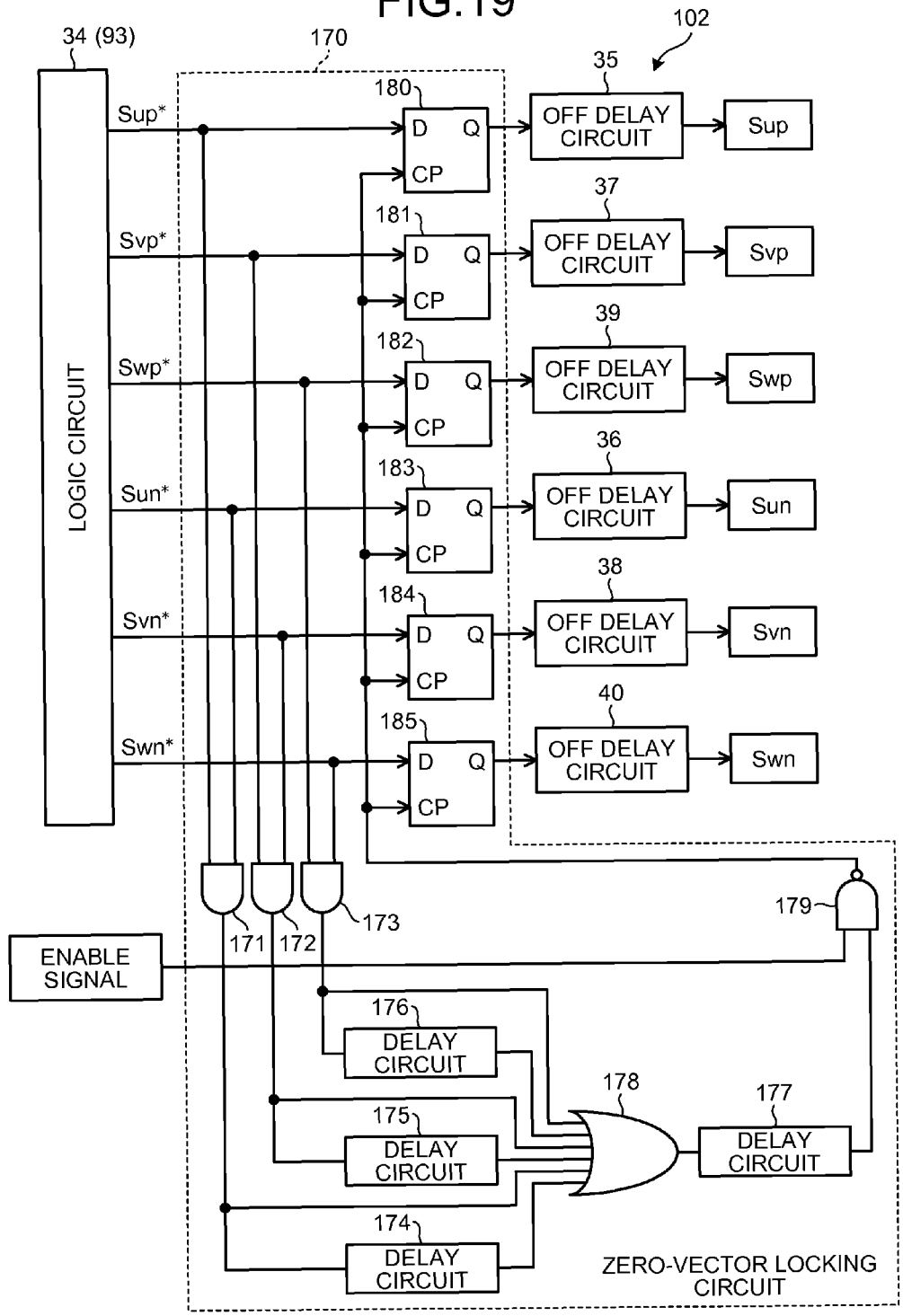
FIG. 19 is a block diagram of a zero-vector locking circuit of a current-source power converting apparatus according to a third embodiment.

As shown in FIG. 19, in the current-source power converting apparatus 102 in the third embodiment, the zero-vector locking circuit 170 is provided between the logic circuit 34 in the first embodiment shown in FIG. 1 (or the logic circuit 93 in the second embodiment shown in FIG. 12) and the off delay circuits 35 to 40. The zero-vector locking circuit 170 is an example of a "zero-vector locking unit". The current-reference generator 31 is an example of a "control unit". The zero-vector locking circuit 170 includes three AND circuits 171 to 173, four delay circuits 174 to 177, an OR circuit 178, a NAND circuit 179, and six D latch circuits 180 to 185. If the zero-vector locking circuit 170 is applied when a modulation factor is small, the pulse width of an effective vector becomes short in some cases by the zero-vector locking circuit 170. When this becomes problematic, this problem can be solved by outputting the enable signal, which switches between operation and non-operation of the zero-vector locking circuit 170 by a current reference generator, and switching by the NAND circuit 179 so that the zero-vector locking circuit 170 is used when a modulation factor is large and is not used when a modulation factor is small. This enable signal can be, for example, generated by providing a threshold Ilow with respect to the current reference vector Iout_r and outputting a signal that turns on when the value of the current reference vector Iout_r is equal to or smaller than threshold Ilow in a comparison circuit. The value of the current reference vector Iout_r can be obtained based on a cosine formula using the values of Ia and Ib in FIG. 7 and a value of cos120° by an operational circuit.

The switch drive signals Sup*, Svp*, Swp*, Sun*, Svn*, and Swn* are input to the D latch circuits 180, 181, 182, 183, 184, and 185. The switch drive signals Sup* and Sun* are input to the AND circuit 171. The switch drive signals Svp* and Svn* are input to the AND circuit 172. The switch drive signals Swp* and Swn* are input to the AND circuit 173.

The AND circuit 171 is connected to the input side of the OR circuit 178 and the input side of the delay circuit 174. The AND circuit 172 is connected to the input side of the OR circuit 178 and the input side of the delay circuit 175. The AND circuit 173 is connected to the input side of the OR circuit 178 and the input side of the delay circuit 176. The output sides of the delay circuits 174 to 176 are connected to the input side of the OR circuit 178. The output side of the OR circuit 178 is connected to the input side of the delay circuit 177. The output side of the delay circuit 177 is connected to the input side of the NAND circuit 179. The enable signal is input to the NAND circuit 179. The output side of the NAND circuit 179 is connected to CP of the D latch circuits 180 to 185. The output sides of the D latch circuits 180 to 185 are connected to the off delay circuits 35 to 40, respectively.

Other configurations of the third embodiment are similar to the first embodiment and the second embodiment.

Next, an operation of the zero-vector locking circuit 170 according to the third embodiment is explained with reference to FIG. 19 to FIG. 23.

First, the switch drive signals Sup*, Svp*, Swp*, Sun*, Svn*, and Swn* are generated by the logic circuit 34 in the first embodiment shown in FIG. 1 (or the logic circuit 93 in the second embodiment shown in FIG. 12). Then, the switch drive signals Sup*, Svp*, Swp*, Sun*, Svn*, and Swn* are input to the zero-vector locking circuit 170. At this time, when the enable signal is H level, the switch drive signals Sup*, Svp*, Swp*, Sun*, Svn*, and Swn* are latched by the D latch circuits 180, 181, 182, 183, 184, and 185 and are output to the off delay circuits 35 to 40, respectively. As the D latch circuits 180 to 185, for example, 74HC75 of a logic circuit IC is used, and, when a signal input to CP is a H level, a signal input to D is directly input to Q and, when a signal input to CP is a L level, a signal of Q is latched and does not change.

Figure 20:
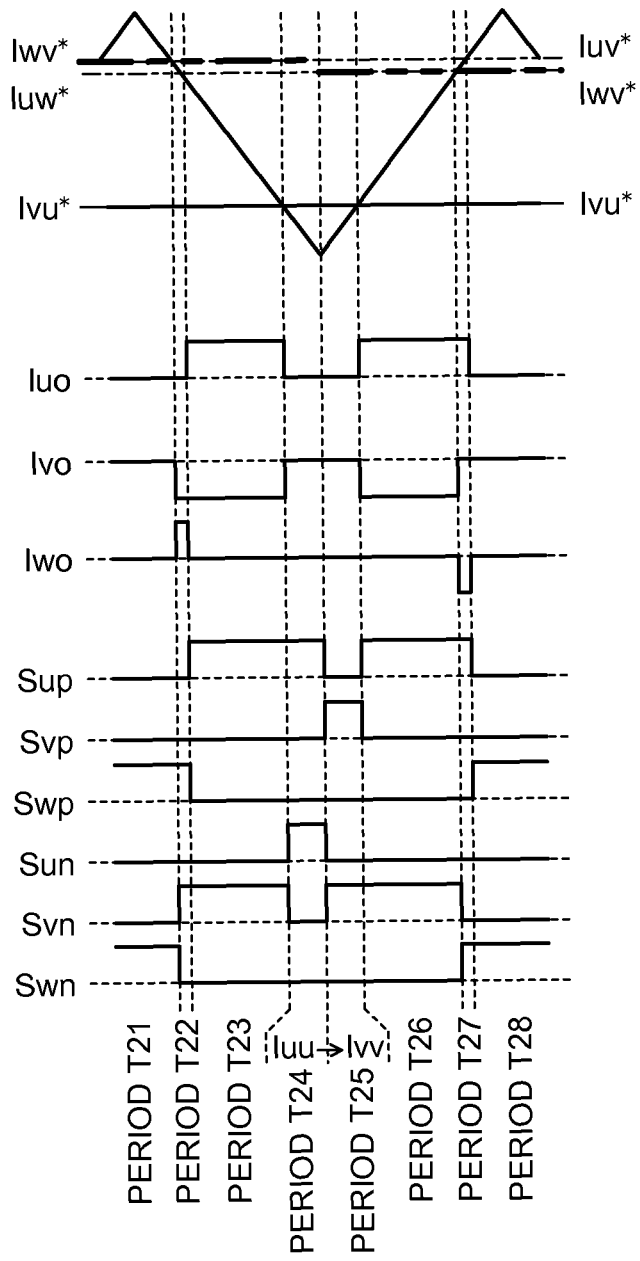
FIG. 20 is a diagram illustrating switch drive signals when a phase of a zero vector is not locked.
Figure 21:
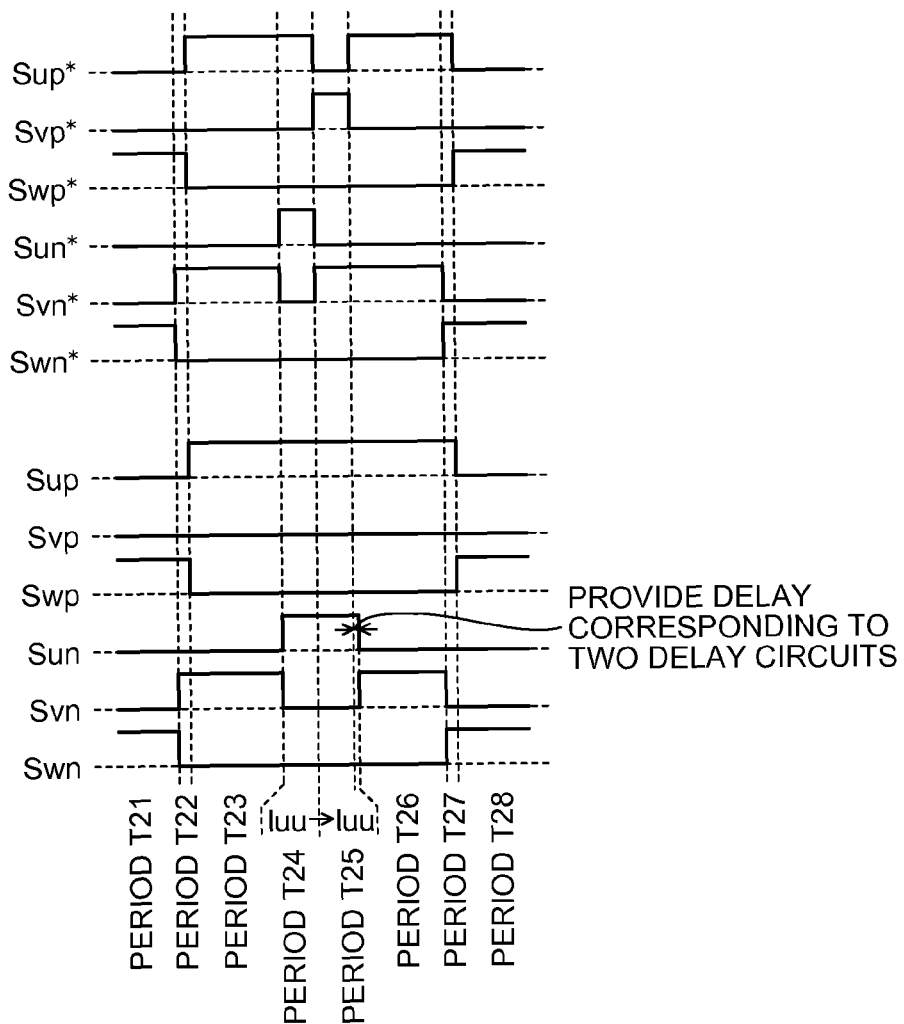
FIG. 21 is a diagram illustrating switch drive signals when a phase of a zero vector is locked.

Then, the AND circuits 171 to 173 determine the state of a zero vector (whether each of the switch drive signals Sup*, Svp*, Swp*, Sun*, Svn*, and Swn* is a H level or a L level). FIG. 20 illustrates an operation of switch drive signals when the zero-vector locking circuit 170 is not used. In an example shown in FIG. 20, the magnitude relation between the line-to-line current references Iwv* and Iuw* is reversed in a period (the period T24 or the period T25) in which the magnitude of the carrier signal is smaller than all of the line-to-line current references Iuw*, Ivu*, and Iwv* and the zero vector Iuu in the period T24 changes to the zero vector Ivy in the period T25 in some cases. It is found that with this change of a zero vector, the time in which Iuu and Ivy are output becomes short and a short pulse may be output. On the contrary, when the zero-vector locking circuit 170 is used, in a case where it is determined that a zero vector is output again in a period next to a period, in which a zero vector is output, by the AND circuits 171 to 173, the delay circuits 174 to 177, and the OR circuit 178, and the state of a zero vector continues, a signal in a L level is input to CP of the D latch circuits 180 to 185. Consequently, the state of a zero vector continues for two periods, so that even if the state is switched when a period changes, as shown in FIG. 21, the zero vector Iuu in the period T24 is output also in the period T25. In other words, a phase of a zero vector in a period, in which the magnitude of the carrier signal is smaller than all of the line-to-line current references Iuw*, Ivu*, and Iwv*, does not change and is locked.

Moreover, as shown in FIG. 20, when a zero vector is switched from Iuu (period T24) to Ivv (period T25), off delay is added to the switch drive signals Sup, Svp, Swp, Sun, Svn, and Swn to be output by the off delay circuits 35 to 40. Therefore, in a period of this off delay, Sup, Svp, Sun, and Svn are turned on to be a rectifier circuit, and an effective vector, which depends on a voltage state of the U-phase, the V-phase, and the W-phase and is not normally needed, is output in some cases. Moreover, when the value of the current reference vector Iout_r becomes large, the output time of a zero vector becomes short, so that, when a zero vector is switched continuously, the width of the switch drive signals Sup, Svp, Sun, and Svn becomes small. Therefore, a zero vector is not output in some cases due to characteristics of on/off of the switching elements 18 to 23 and delay of the switch drive signals Sup, Svp, Sun, and Svn. On the other hand, a phase of a zero vector is locked by the zero-vector locking circuit 170, so that output of an effective vector, which is not normally needed, is suppressed. In this manner, it is suppressed that a zero vector, which is normally needed, is not output due to a short pulse generated when the value of the current reference vector Iout_r is large.

Moreover, as shown in FIG. 21, when the zero-vector locking circuit 170 is driven, a signal is caused to pass two delay circuits, i.e., one of the delay circuits 174 to 176 and the delay circuit 177 to provide delay of a signal for two delay circuits to the switch drive signals Sun and Svn. This delay is needed for suppressing generation of a glitch, and the effect of the delay of a signal for the two delay circuits can be ignored by causing the delay time of the delay circuits to be approximately equal to one clock of a PWM pulse signal. This is because one clock time (delay time of a signal for the two delay circuits) in one cycle of a PWM carrier is small enough to be ignored compared with a PWM pulse signal in one cycle of a PWM carrier.

Figure 22:
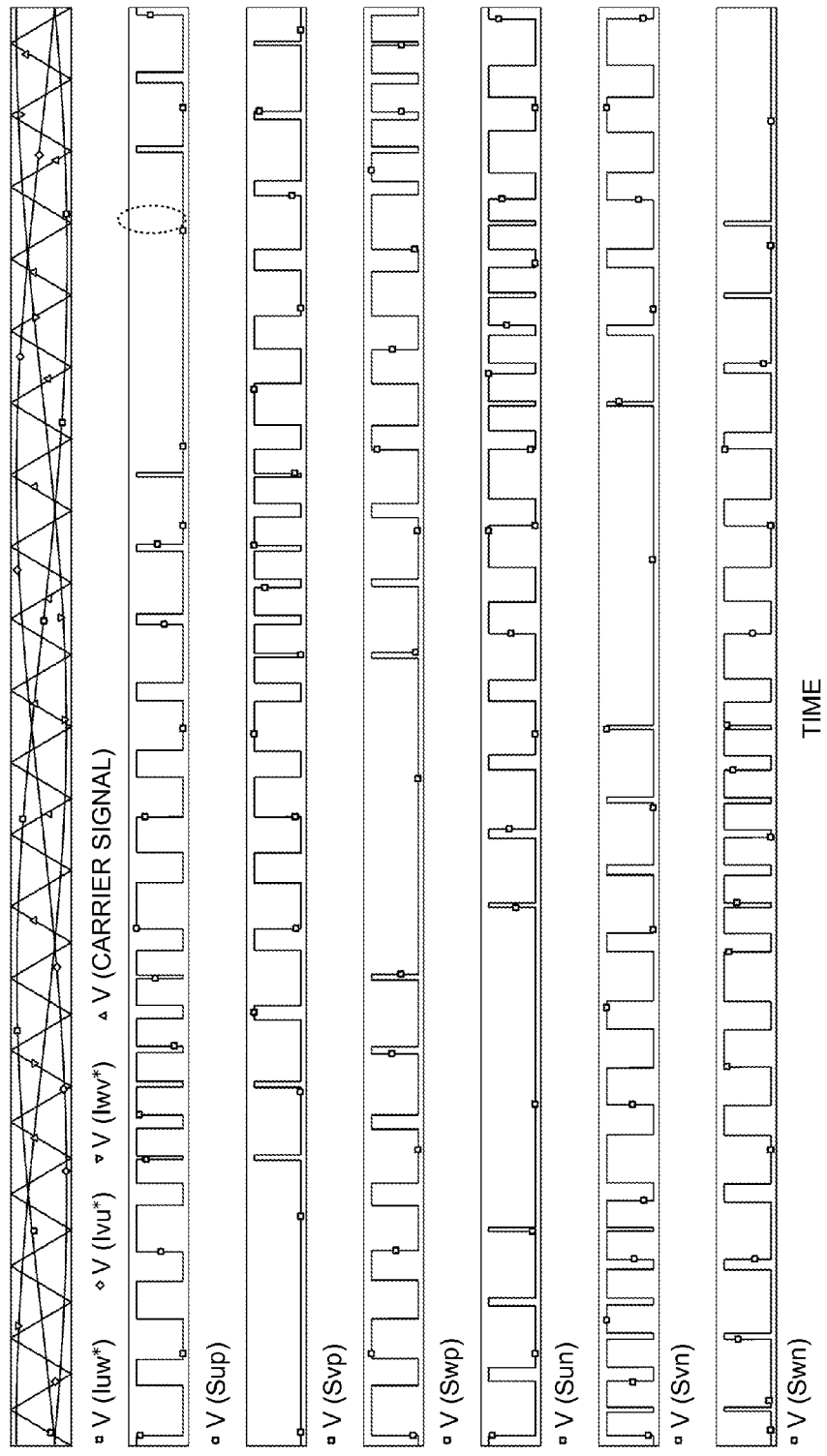
FIG. 22 is a diagram illustrating switch drive signals when the zero-vector locking circuit is applied to the current-source power converting apparatus according to the first embodiment.

Moreover, FIG. 22 illustrates the switch drive signals Sup, Svp, Swp, Sun, Svn, and Swn when the zero-vector locking circuit 170 is provided in the current-source power converting apparatus 100 in the first embodiment. For example, a pulse P1 of the switch drive signal Sup having a relatively short width in the first embodiment shown in FIG. 9 is not generated as shown in FIG. 22 by locking a zero vector to a zero vector immediately before the pulse P1 by the zero-vector locking circuit 170 (see a dotted circular portion in FIG. 22).

Figure 23:
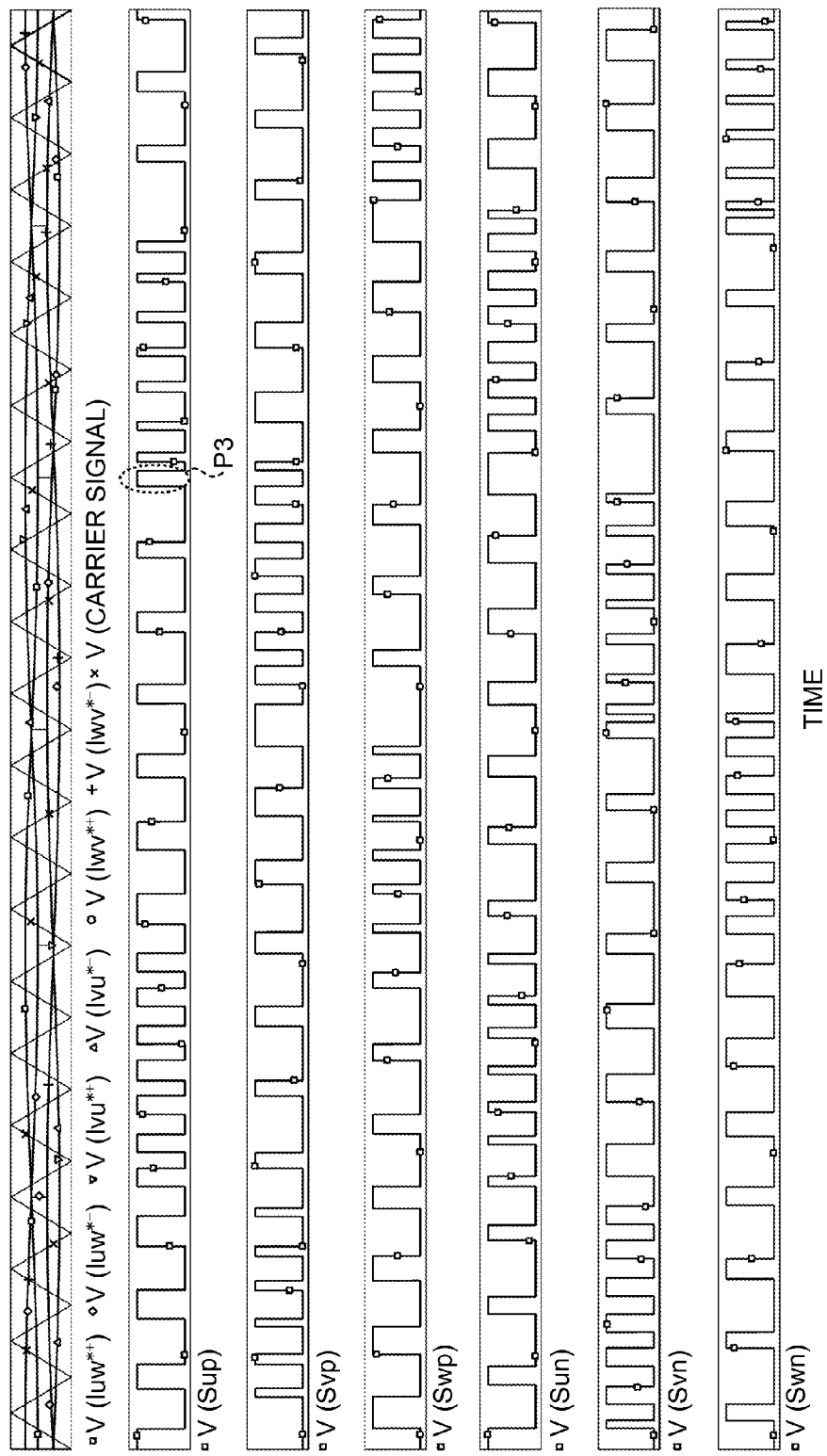
FIG. 23 is a diagram illustrating switch drive signals when the zero-vector locking circuit is applied to the current-source power converting apparatus according to the second embodiment.

Moreover, FIG. 23 illustrates the switch drive signals Sup, Svp, Swp, Sun, Svn, and Swn when the zero-vector locking circuit 170 is provided in the current-source power converting apparatus 101 in the second embodiment. For example, the width of a pulse P2 of the switch drive signal Sup having a relatively short width in the second embodiment shown in FIG. 17 becomes large as a pulse P3 shown in FIG. 23 by locking a zero vector by the zero-vector locking circuit 170 (see a dotted circular portion in FIG. 23).

In the third embodiment, as described above, the zero-vector locking circuit 170 is provided for locking a phase of a zero vector in a period in which a zero vector is output. Consequently, it is possible to suppress that a zero vector, which is generated due to continuous switching of a zero vector and is not normally needed, is output and a zero vector is not output when it is normally needed, so that distortion of an output current can be suppressed.

In the first to third embodiments, an example of using a sine wave as a line-to-line current reference is illustrated, however, a line-to-line current reference is not limited to this. For example, triple harmonic, which is harmonic, may be superimposed on a line-to-line current reference. Consequently, the peak of a line-to-line current reference becomes small (line-to-line current reference becomes a flat shape), so that saturation of a line-to-line current reference (line-to-line current reference becomes larger than the carrier signal) can be suppressed.

Moreover, in the first to third embodiments, an example of applying the above components to the current-source power converting apparatus, from which a three-phase AC current is output, is explained, however, the current-source power converting apparatus is not limited to this. For example, the above components can be applied to a current-source power converting apparatus from which AC current, whose number of phases is not three, is supplied.

Moreover, in the first to third embodiments, an example of applying the above components to the current-source power converting apparatus, to which DC current is supplied from a DC source, is illustrated, however, the current-source power converting apparatus is not limited to this. For example, the above components can be applied to a current-source power converting apparatus to which current is supplied from an AC source.

Moreover, in the first embodiment, an example in which two types of zero vectors appear during one cycle of a PWM carrier (for example, two types of zero vectors appear in order of Iww, Ivv, and Iww in the region A) is illustrated, however, the current-source power converting apparatus is not limited to this. For example, it is possible that an offset amount is superimposed on a line-to-line current reference and a line-to-line current reference on one phase is saturated to stop (stop Ivv from appearing) on/off of a switching element of this phase. In this case also, different from a case where the same zero vector appears in order of Iww, Iww, and Iww during one cycle of a PWM carrier, the state of output changes in order of output of Iww→no output of a zero vector→output of Iww during one cycle of a PWM carrier, so that generation of a short pulse is suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A current-source power converting apparatus comprising:
   a plurality of switching elements that are provided to correspond to each of output phases of three phases;
   a current-reference generating unit that outputs a plurality of phase current references corresponding to the output phases, respectively, and a plurality of line-to-line current references corresponding to output interphases, which are different from each other, respectively;
   a polarity determining unit that determines polarities of the phase current references;
   a PWM-pulse-signal generating unit that generates a plurality of PWM pulse signals corresponding to the output interphases, respectively, by comparing the line-to-line current references and a carrier signal; and
   a drive-signal generating unit that generates drive signals corresponding to the output phases, respectively, based on AND operations of two or more of the PWM pulse signals and polarities of two or more of the phase current references, the drive signals driving the switching elements.

2. The current-source power converting apparatus according to claim 1, wherein the drive-signal generating unit selects a phase of a zero vector output when a magnitude of the carrier signal is larger than all of the line-to-line current references and a phase of a zero vector output when a magnitude of the carrier signal is smaller than all of the line-to-line current references to be different from each other, based on polarities of the phase current reference.

3. The current-source power converting apparatus according, to claim 1, wherein the drive-signal generating unit. generates, based on AND operations of two PWM pulse signals with respect to different interphases having one phase in common, and polarities of phase current references corresponding to two phases excluding the one phase, the drive signal corresponding to the one phase.

4. The current-source power converting apparatus according to claim 1, wherein
   the current-reference generating unit outputs a plurality of line-to-line current references, to which an offset is added according to a mutual-magnitude relationship of the line-to-line current references, for each of the interphases as the line-to-line current references,
   the PWM-pulse-signal generating unit generates the PWM pulse signals corresponding to the output interphases, respectively, by comparing the line-to-line current references to which the offset is added and the carrier signal, and
   the drive-signal generating unit generates drive signals corresponding to the output phases, respectively, based on AND operations of three PWM pulse signals corresponding to the interphases, respectively, and polarities of the phase current references corresponding to the output phases, respectively.

5. The current-source power converting apparatus according to claim 1, further comprising a zero-vector locking unit that is provided on an output side of the drive-signal generating unit and, when outputting a zero vector again in a next period of a period in which a zero vector is output, continues to output a zero vector, which is same as the zero vector in the last period, in the next period.

6. The current-source power converting apparatus according to claim 5, further comprising a control unit that switches between a case of driving the zero-vector locking unit and a case of not driving the zero-vector locking unit according to a magnitude of the line-to-line current reference.

7. The current-source power converting apparatus according to claim 5, further comprising a control unit that drives the zero-vector locking unit when the line-to-line current reference is larger than a predetermined value.

8. A current-source power converting apparatus comprising:
   a plurality of switching means that are provided to correspond to each of output phases of three phases;
   a current-reference generating means for outputting a plurality of phase current references corresponding to the output phases, respectively, and a plurality of line-to-line current references corresponding to output interphases, which are different from each other, respectively;
   a polarity determining means for determining polarities of the phase current references;
   a PWM-pulse-signal generating means for generating a plurality of PWM pulse signals corresponding to the output interphases, respectively, by comparing the line-to-line current references and a carrier signal; and
   a drive-signal generating means for generating drive signals corresponding to the output phases, respectively, based on AND operations of two or more of the PWM pulse signals and polarities of two or more of the phase current references, the drive signals driving the switching elements.

* * * * *